US012221339B2

(12) United States Patent
Yang et al.

(10) Patent No.: US 12,221,339 B2
(45) Date of Patent: Feb. 11, 2025

(54) SEMICONDUCTOR DEVICE AND METHOD OF MANUFACTURING SEMICONDUCTOR DEVICE

(71) Applicant: Amkor Technology Singapore Holding Pte. Ltd., Valley Point (SG)

(72) Inventors: Ki Yeul Yang, Incheon (KR); Kyung Han Ryu, Incheon (KR); Seok Hun Yun, Incheon (KR); Bora Baloglu, Oporto (PT); Hyun Cho, Incheon (KR); Ramakanth Alapati, Dublin, CA (US)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

(21) Appl. No.: 18/436,950

(22) Filed: Feb. 8, 2024

(65) Prior Publication Data
US 2024/0190700 A1 Jun. 13, 2024

Related U.S. Application Data

(62) Division of application No. 17/832,904, filed on Jun. 6, 2022, now Pat. No. 11,897,761, which is a division
(Continued)

(51) Int. Cl.
*H01L 23/48* (2006.01)
*B81B 7/00* (2006.01)
*B81C 1/00* (2006.01)

(52) U.S. Cl.
CPC .......... *B81C 1/00182* (2013.01); *B81B 7/007* (2013.01); *B81C 1/00158* (2013.01);
(Continued)

(58) Field of Classification Search
CPC ...... B81B 1/00–008; B81B 3/00–0097; B81B 5/00; B81B 7/00–04;
(Continued)

(56) References Cited

U.S. PATENT DOCUMENTS 8,921,955 B1 * 12/2014 Lee ...................... B81B 7/0061
257/416
2012/0237073 A1 9/2012 Goida
(Continued)

FOREIGN PATENT DOCUMENTS

CN 109511066 A 3/2019

OTHER PUBLICATIONS

Search Report from CNIPA for PRC Patent Application No. 202010562496.7 Received Jun. 5, 2024.
(Continued)

*Primary Examiner* — Moin M Rahman
(74) *Attorney, Agent, or Firm* — Kevin B. Jackson

(57) ABSTRACT

In one example, an electronic device includes a semiconductor sensor device having a cavity extending partially inward from one surface to provide a diaphragm adjacent an opposite surface. A barrier is disposed adjacent to the one surface and extends across the cavity, the barrier has membrane with a barrier body and first barrier strands bounded by the barrier body to define first through-holes. The electronic device further comprises one or more of a protrusion pattern disposed adjacent to the barrier structure, which can include a plurality of protrusion portions separated by a plurality of recess portions; one or more conformal membrane layers disposed over the first barrier strands; or second barrier strands disposed on and at least partially overlapping the first barrier strands. The second barrier strands define second through-holes laterally offset from the first through-holes. Other examples and related methods are also disclosed herein.

19 Claims, 37 Drawing Sheets

Related U.S. Application Data of application No. 16/448,901, filed on Jun. 21, 2019, now Pat. No. 11,352,252.

(52) U.S. Cl.
CPC ........ *B81C 1/00301* (2013.01); *H01L 23/481* (2013.01); *B81B 2201/02* (2013.01)

(58) Field of Classification Search
CPC .......... B81B 2201/00–13; B81B 2203/00–06; B81B 2207/00–99; B81B 7/007; B81B 7/0061; B81B 2201/0257; B81B 2201/0264; B81B 2203/0127; B81B 2207/012; B81B 7/0009; B81B 7/02; B81B 2203/0118; B81B 3/0018–0032; B81B 3/0051; B81B 3/0064; B81B 3/007; B81B 2203/0307; B81B 2203/0361; B81B 2201/02–0292; B81B 2203/0315; B81C 2203/0728; B81C 2203/0735; B81C 2203/0742; B81C 1/00603; B81C 3/002–007; B81C 99/007; B81C 2203/05–058; B81C 1/00182; B81C 1/00158; B81C 1/00301; B81C 1/00015; B81C 1/00–0092; B81C 3/00–008; B81C 99/00–0095; B81C 2201/00–117; B81C 1/00214; B81C 1/00222–00253; B81C 1/0023; B81C 1/00261–00333; B81C 2203/01–019; B81C 1/00269; B81C 1/00277–00293; H01L 23/481; H01L 2224/48137; H01L 2224/73265; H01L 2924/10158; H01L 2924/15151; H01L 25/00; H04R 19/005; H04R 19/04; H04R 31/00; H04R 2201/003; G01N 27/129

See application file for complete search history.

(56) References Cited

U.S. PATENT DOCUMENTS

| | | |
|---|---|---|
| 2016/0137486 A1 | 5/2016 | Bharatan |
| 2019/0090067 A1 | 3/2019 | Perletti |
| 2019/0132662 A1 | 5/2019 | Cheng |
| 2019/0385977 A1 | 12/2019 | Elsherbini |

OTHER PUBLICATIONS

Search Report from TIPO for ROCC Patent Application No. 113112975 Received Jul. 10, 2024.

\* cited by examiner

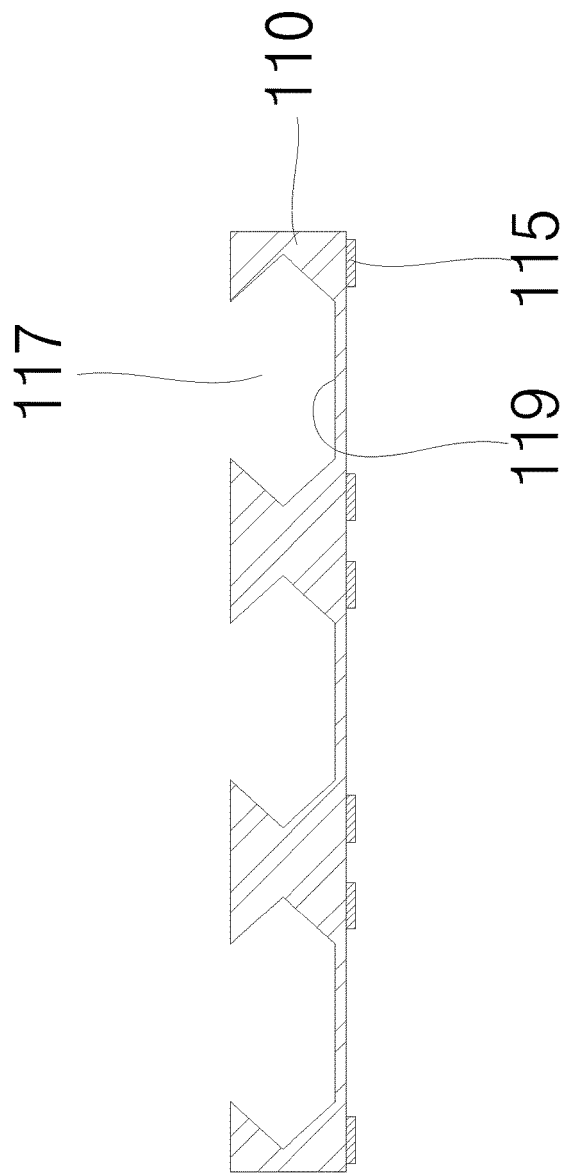
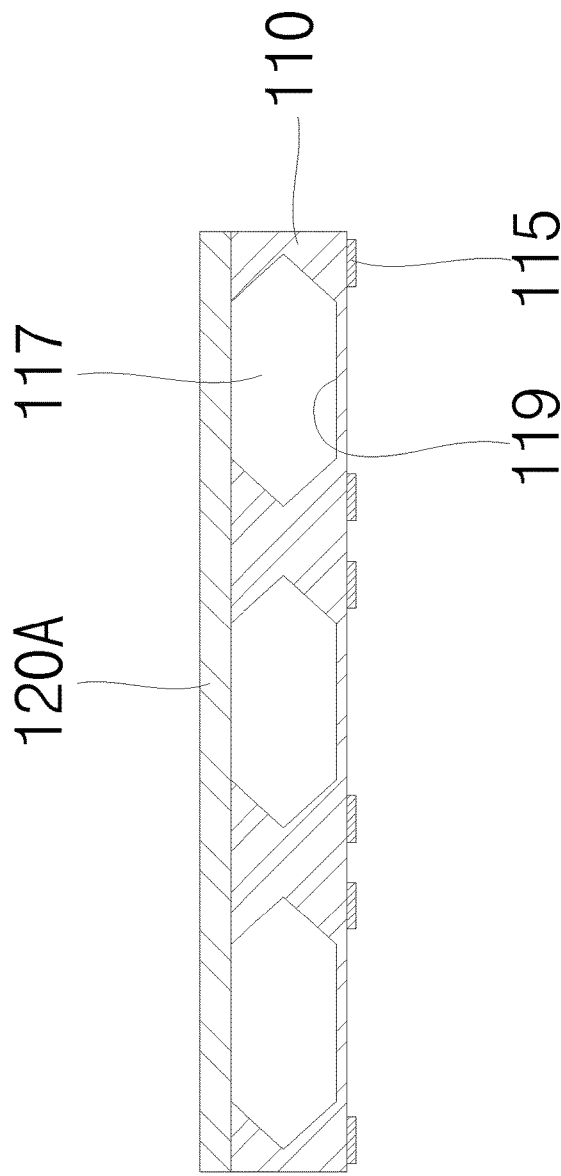

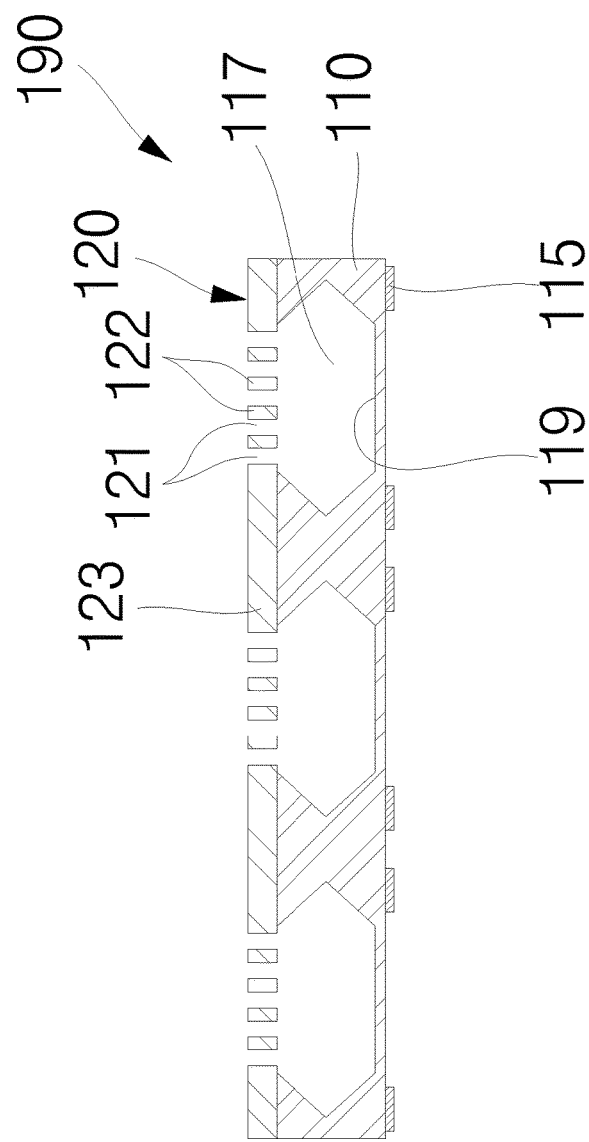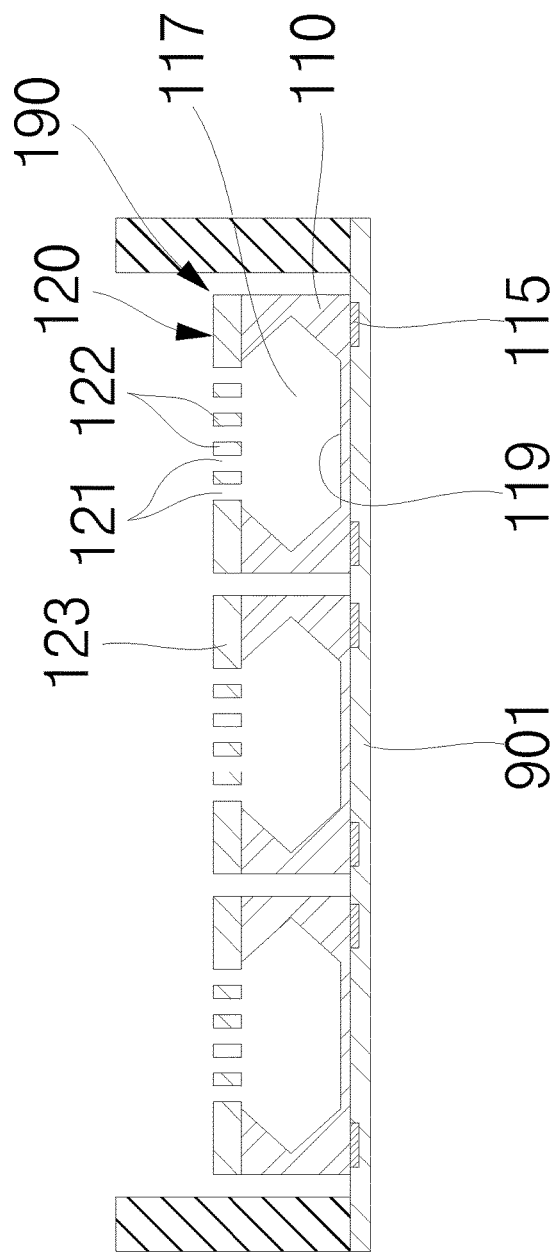

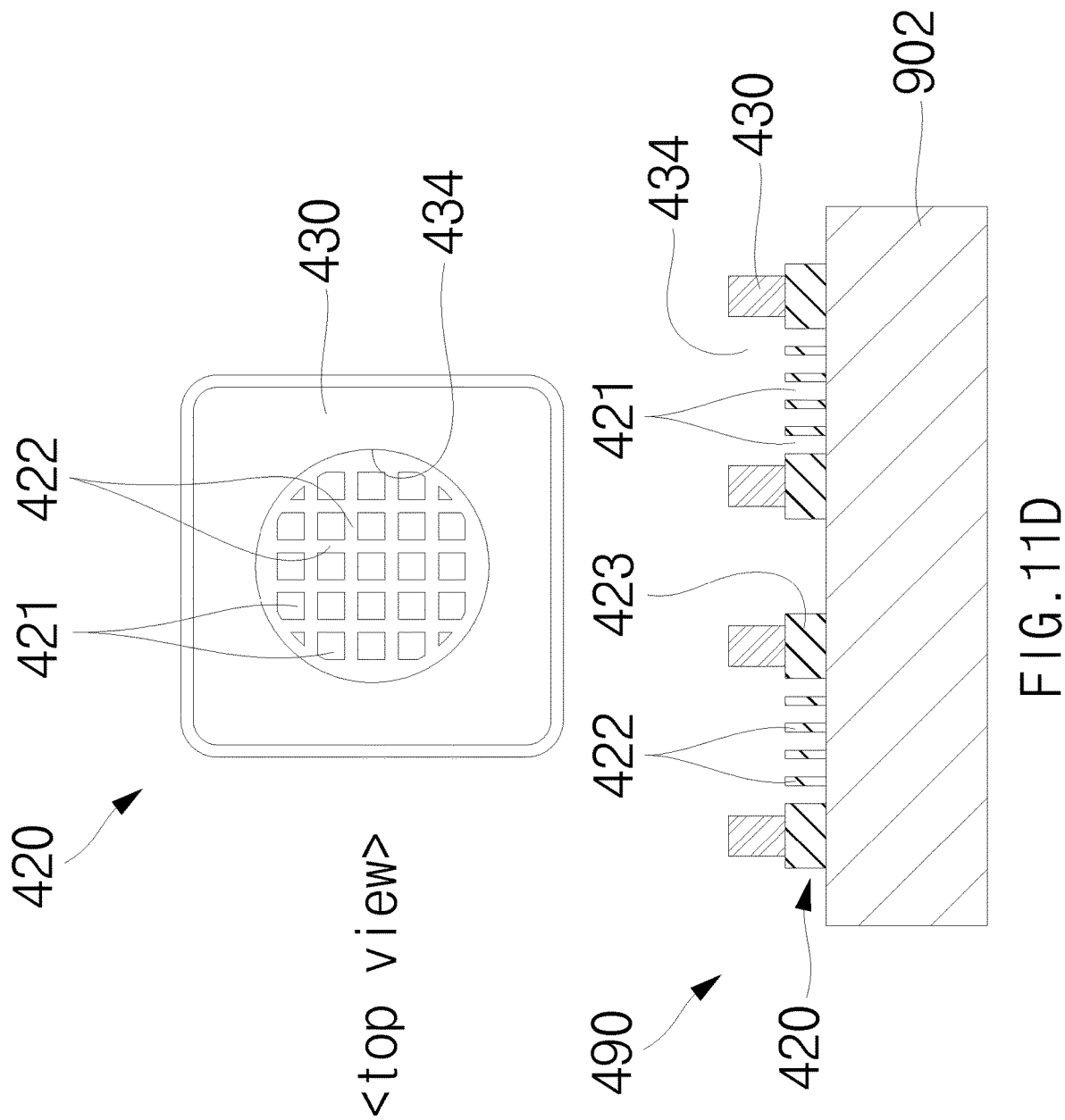

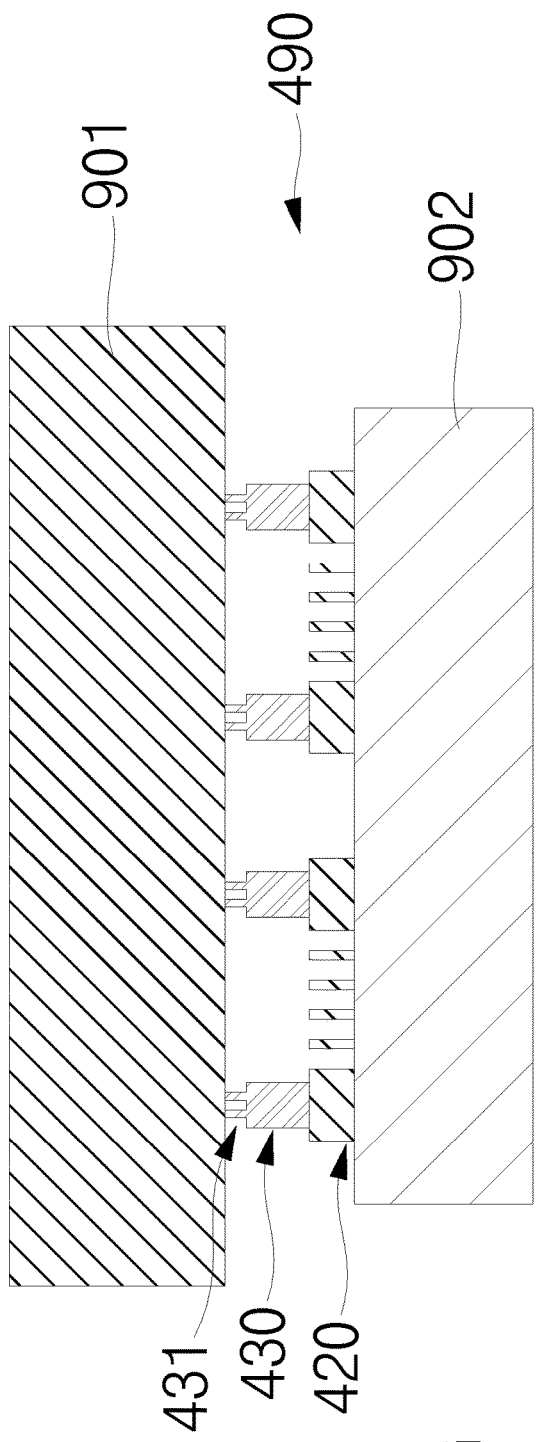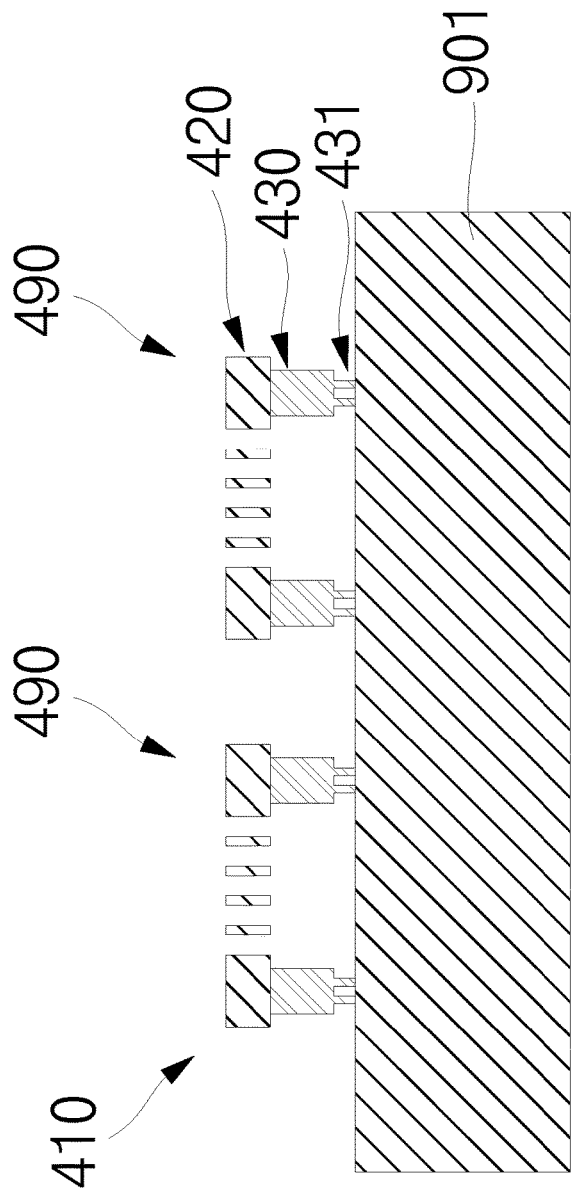
FIG. 11G
FIG. 11H

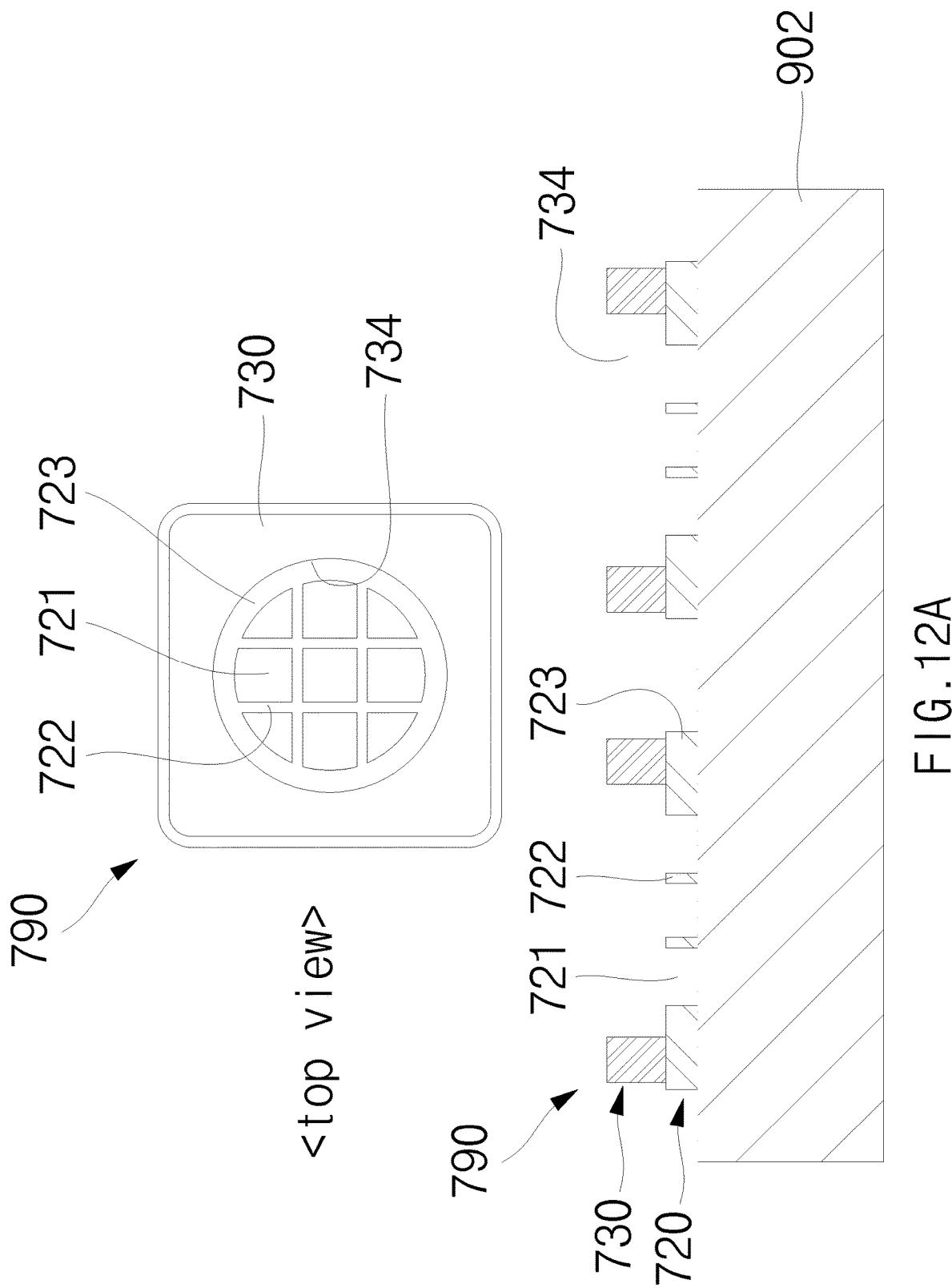

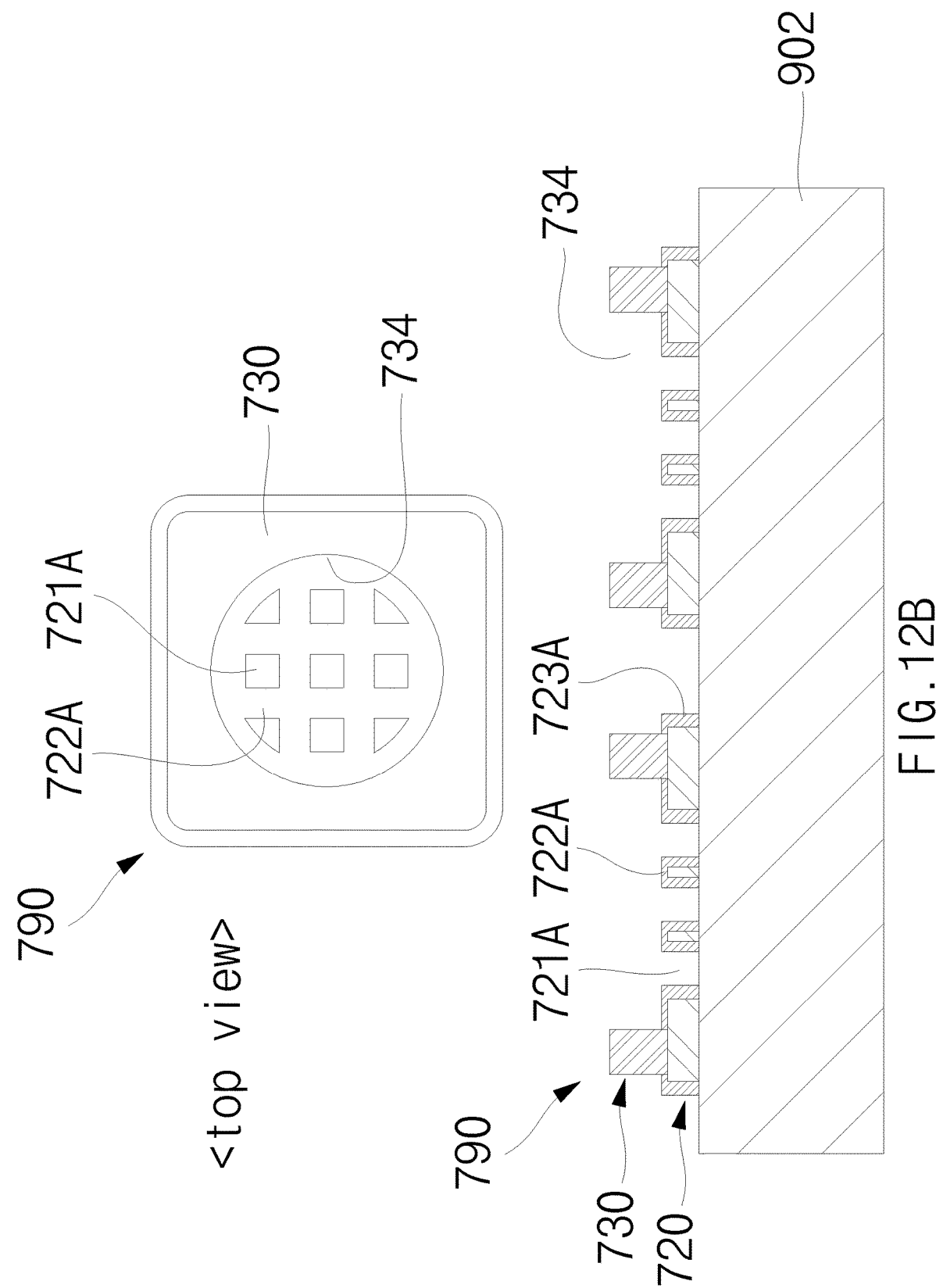

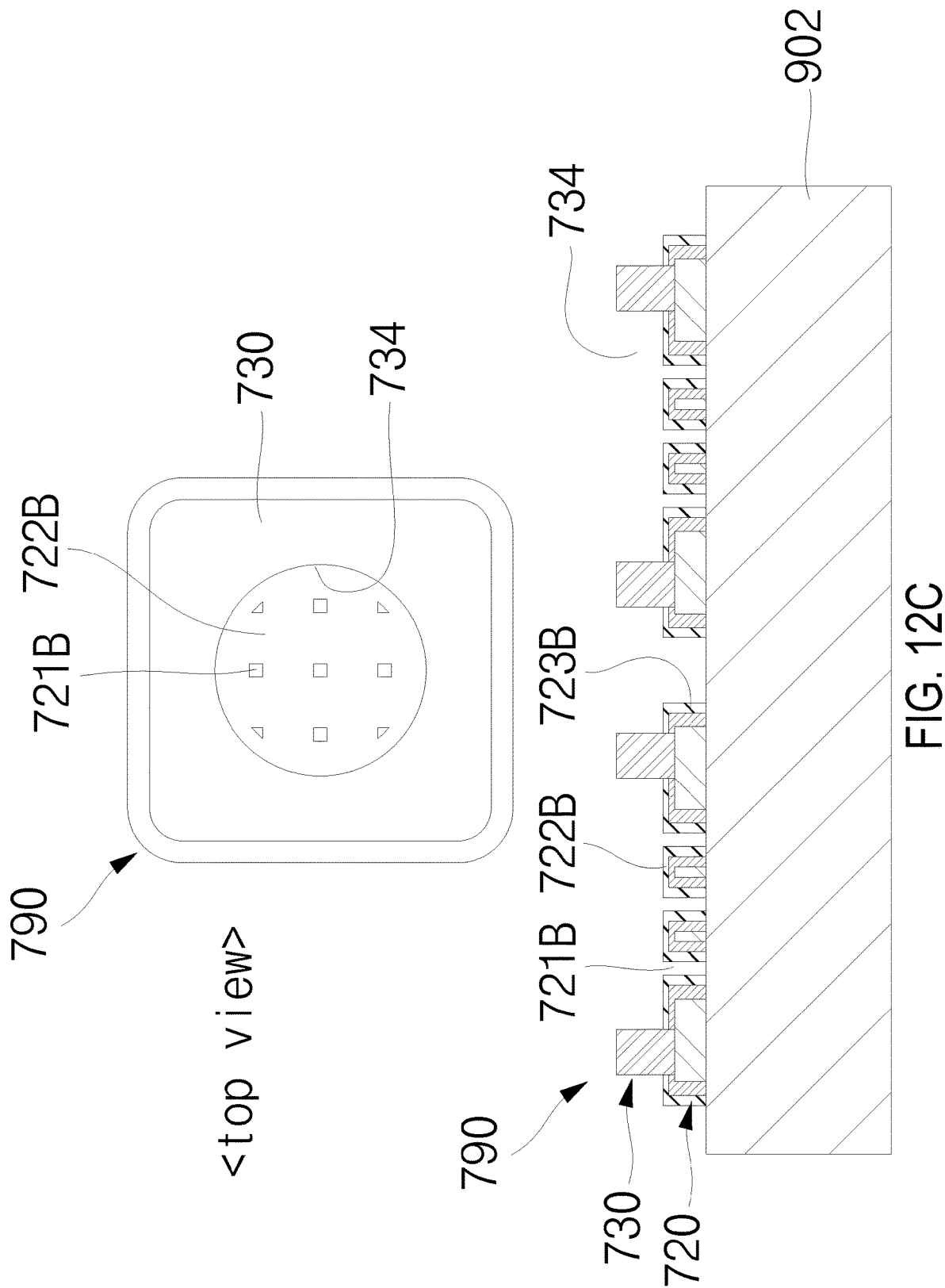

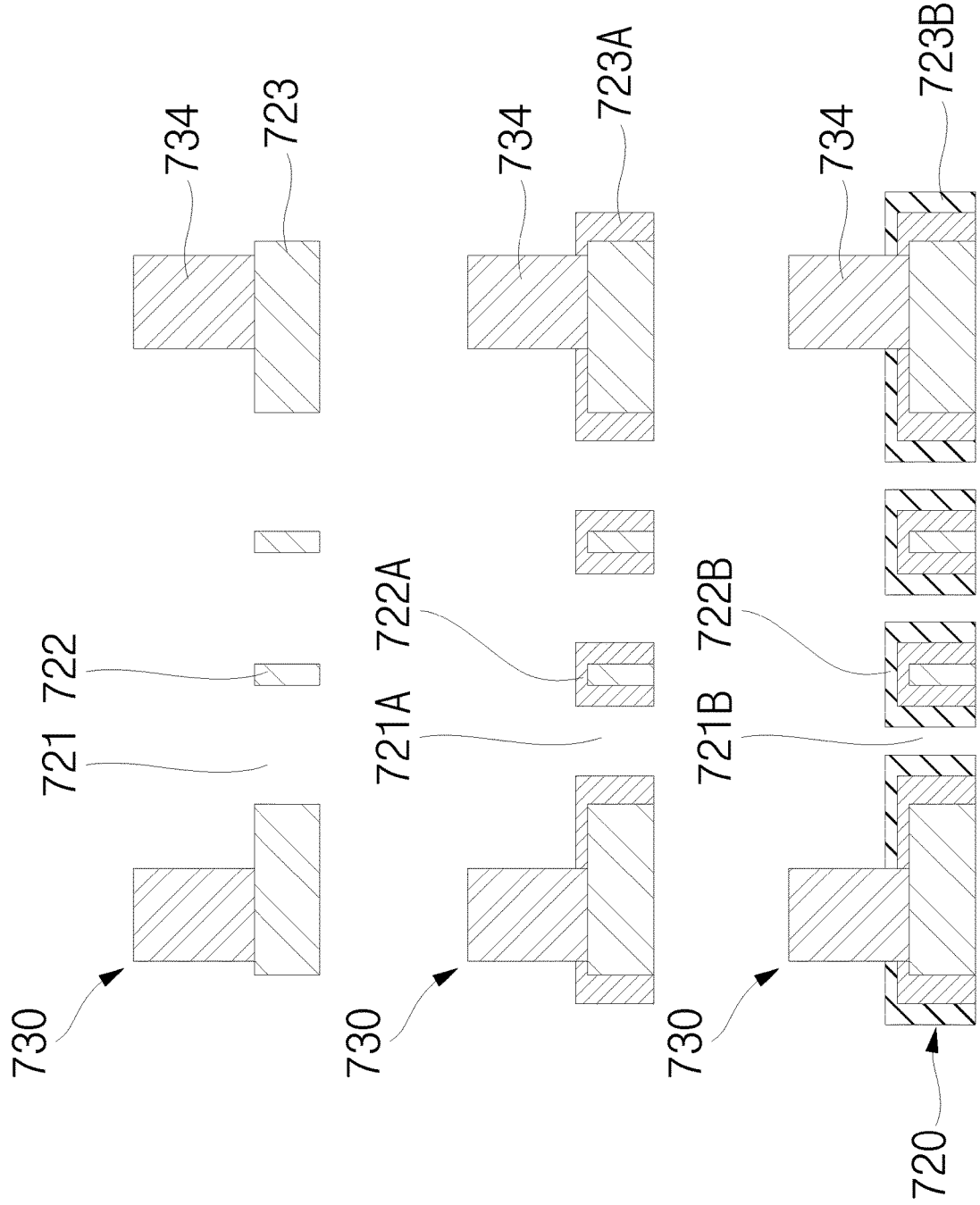

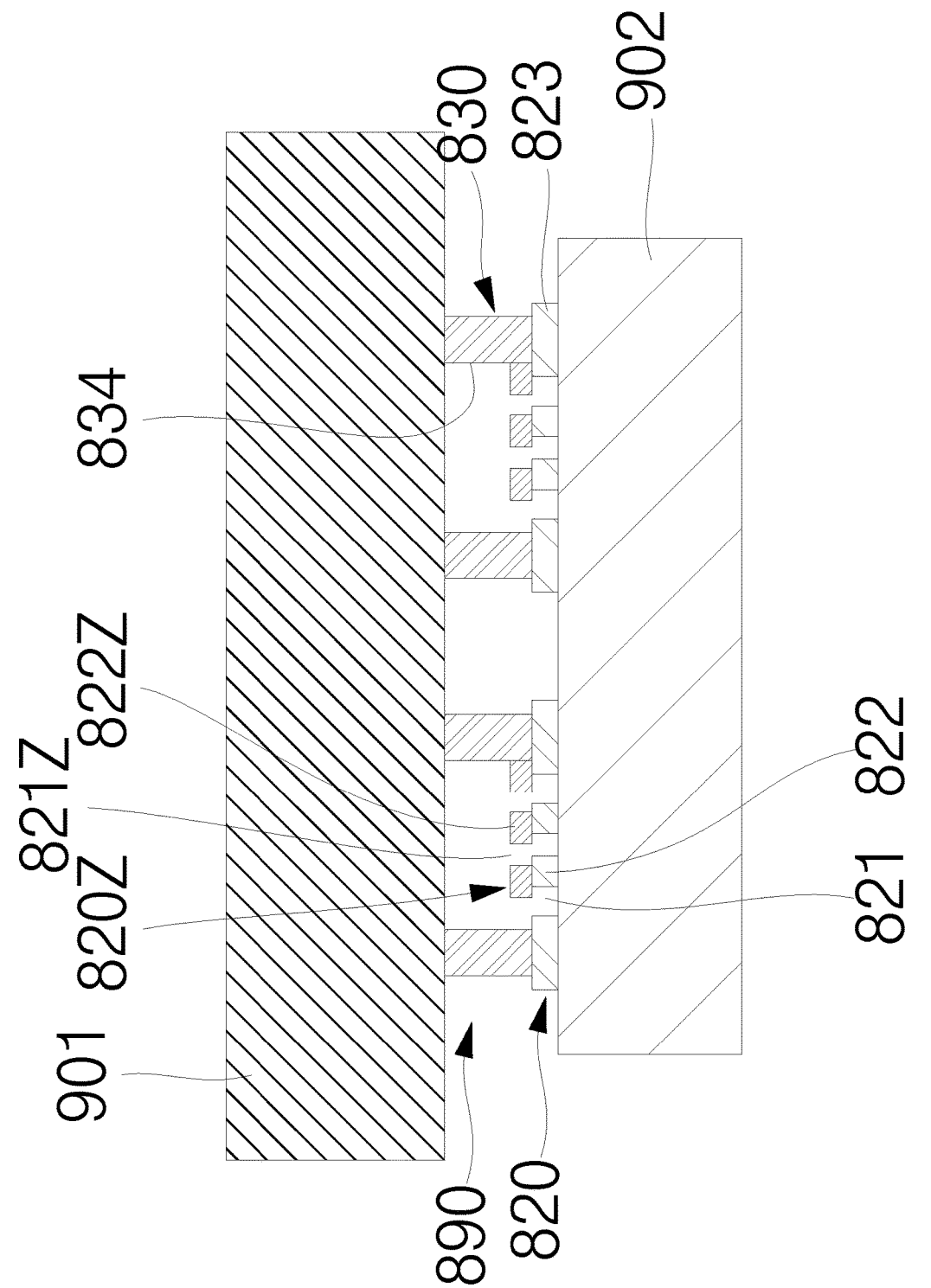

SEMICONDUCTOR DEVICE AND METHOD OF MANUFACTURING SEMICONDUCTOR DEVICE

CROSS-REFERENCE TO RELATED APPLICATIONS

The present application is a divisional application of co-pending U.S. patent application Ser. No. 17/832,904 filed on Jun. 6, 2022 and issued as U.S. Pat. No. 11,897,761 on Feb. 13, 2024, which is a divisional application of U.S. patent application Ser. No. 16/448,901 filed on Jun. 21, 2019 and issued as U.S. Pat. No. 11,352,252 on Jun. 7, 2022, which is expressly incorporated by reference herein, and priority thereto is hereby claimed.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 4A, 4B, 4C, 4D, 4E, 4F, and 4G show cross-sectional views of an example method for manufacturing an example semiconductor device.

FIGS. 11A, 11B, 11C, 11D, 11E, 11F, 11G, 11H, and 11I show cross-sectional views and top views of an example method for manufacturing an example barrier.

FIGS. 12A, 12B, 12C, 12D, and 12E show cross-sectional views and top views of an example method for manufacturing an example barrier.

FIGS. 13A and 13B show cross-sectional views of an example method for manufacturing an example barrier.

FIGS. 14A, 14B, 14C, 14D, 14E, and 14F show cross-sectional views and top views of an example method for manufacturing an example barrier.

Figure 1:
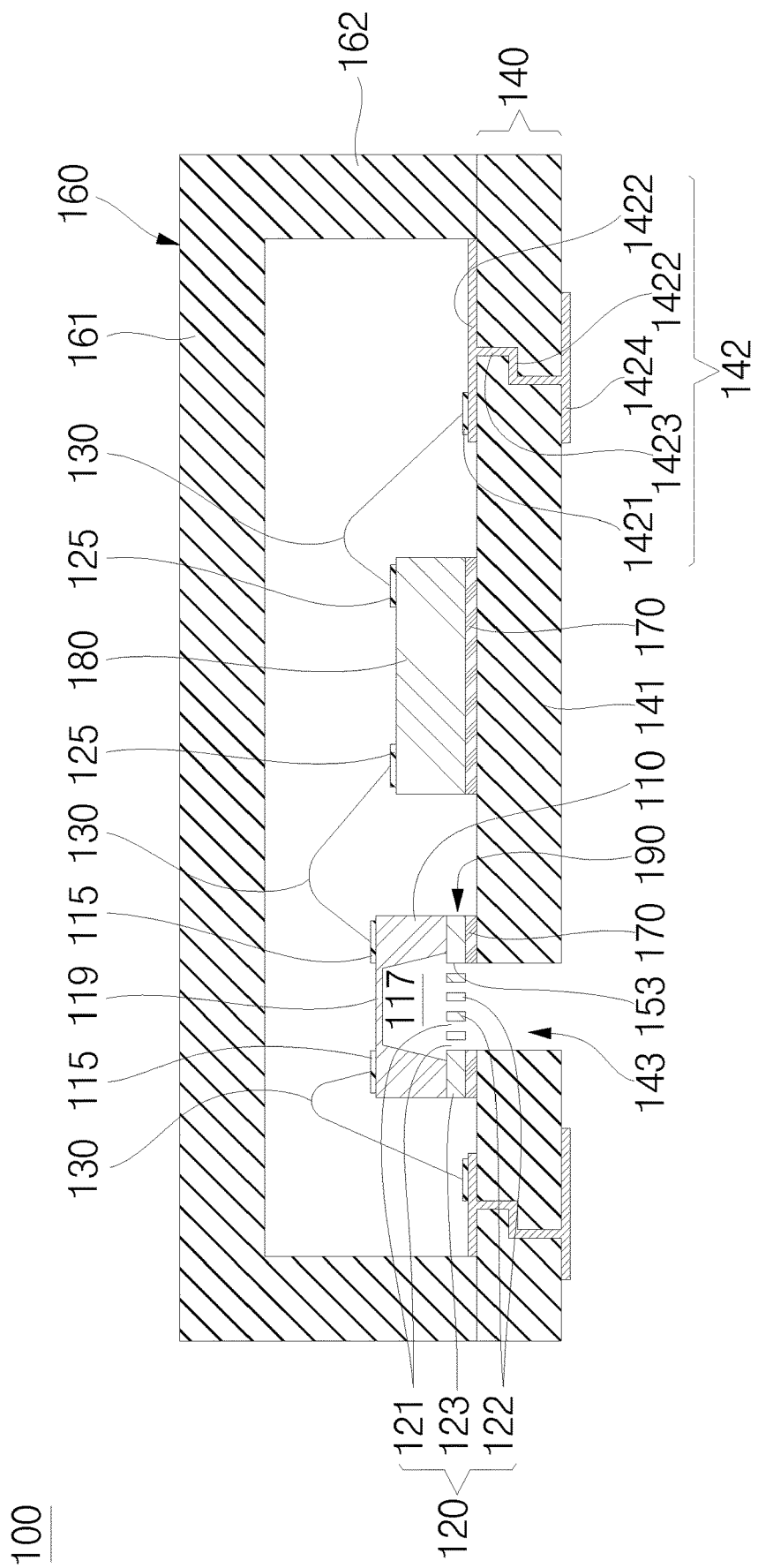
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The terms "and/or" include any single item, or any combination of the items, in the list joined by "and/or". As used in this disclosure, the singular forms are intended to include the plural forms as well, unless the context clearly indicates otherwise.

The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. For example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements. It is further understood that the examples illustrated and described hereinafter suitably may have examples and/or may be practiced in the absence of any element that is not specifically disclosed herein.

DETAILED DESCRIPTION OF THE DRAWINGS

The present description includes, among other features, a packaged electronic device structure and associated methods that include a barrier disposed adjacent to a surface of an electronic device. In some examples, the electronic device is a sensor device with a cavity and a diaphragm and the barrier extends across the cavity. In some examples, the barrier includes a membrane having a barrier body and first barrier strands bounded by the barrier body and defining first through-holes. In some examples, conformal membrane layers can be added to the first barrier strands to reduce the size of the first through-holes. In other examples, second barrier strands can be added on and at least partially overlapping the first barrier strands. The second barrier strands define second through-holes laterally offset from the first through-holes.

In some examples, a protrusion pattern is disposed as part of the barrier, which can be configured to reduce the contact area of the barrier to contact films used during the fabrication process This advantageously improves the ease in which the electronic die can be removed from the contact film during, for example, pick-and-place processing. In further examples, the barrier structure can be formed while the electronic device is among a plurality of electronic devices as part of a semiconductor wafer or in wafer form to improve manufacturability of the electronic devices. In other examples, the barrier includes a stiffener structure to increase the rigidity of the membrane. The barrier is configured to prevent or reduce the likelihood that contaminates, such as particulates, will reach, contact, or interfere with the diaphragm of the electronic device thereby improving device reliability.

More particularly, in one example, a semiconductor device includes a first electronic device comprising a first surface and a second surface opposite to the first surface. A barrier is disposed adjacent to the second surface of the first electronic device and includes a first membrane having a first barrier body, and first barrier strands bounded by the first barrier body and defining first through-holes, wherein at least one first through-hole has a first dimension between a pair of adjacent first barrier strands. The structure includes a reducing structure couple to the first membrane to reduce the first dimension. In other examples, the reducing structure can include one or more conformal membrane layers on the first barrier strands. In other examples, the reducing structure can include second barrier strands on the first barrier strands and defining second through-holes. The second through-holes are laterally offset from the first through-holes. In other examples, the barrier includes a protrusion pattern having an outer surface comprising a non-planar shape.

In another example, an electronic device comprises a first electronic device having g a first surface and a second surface opposite to the first surface, and a cavity extending partially inward from the second surface to provide a diaphragm adjacent to the first surface. A barrier is disposed adjacent to the second surface of the first electronic device, wherein the barrier extends across the cavity. The barrier comprises a first membrane comprising a first barrier body and first barrier strands bounded by the first barrier body and defining first through-holes. The barrier further comprises one or more of a protrusion pattern having an outer surface comprising a non-planar shape; one or more conformal membrane layers disposed over the first barrier strands; or second barrier strands on the first barrier strands and defining second through-holes that are laterally offset from the first through-holes. In some examples, the protrusion pattern comprises a plurality of protrusion portions separated by a plurality of recess portions.

In a further example, a method of forming an electronic device includes providing a first electronic device comprising a first surface and a second surface opposite to the first surface, and a cavity extending partially inward from the second surface to provide a diaphragm adjacent to the first surface. The method includes providing a barrier coupled to the second surface of the first electronic device, the barrier comprising a membrane having a first barrier body and first barrier strands defining first through-holes; and one or more of a protrusion pattern having an outer surface comprising a non-planar shape; one or more conformal membrane layers disposed over the first barrier strands; or second barrier strands on the first barrier strands and defining second through-holes that are laterally offset with respect to the first through-holes.

Other examples are included in the present disclosure. Such examples may be found in the figures, in the claims, and/or in the description of the present disclosure.

FIG. 1 shows a cross-sectional view of an example packaged electronic device 100, such as a semiconductor device 100. In the example shown in FIG. 1, semiconductor device 100 can comprise electronic devices 110 and 180, interconnection 130, base substrate 140, barrier 190 and cover structure 160.

Electronic device 110 can comprise device interconnect 115, cavity 117, and diaphragm 119. Electronic device 180 can comprise corresponding device interconnect 125. Base substrate 140 can comprise dielectric structure 141, conductive structure 142, such as base interconnect 1421, trace 1422, via 1423 or external interconnect 1424, and passageway 143. Barrier or barrier structure 190 can comprise barrier through-holes 121; barrier membrane 120, barrier strands, or barrier strand structure 122; and barrier body 123. In some examples, barrier strand structure 122 defines a plurality of through-holes or through-hole portions 121. Cover structure 160 can comprise cover wall 161 and side wall 162. In some examples, adhesive 170 can be interposed between electronic device 110 and base substrate 140, and/or adhesive 170 can be interposed between electronic device 180 and base substrate 140. Base substrate 140 and/or cover structure 160 can be commonly applied to example semiconductor devices disclosed in the present disclosure.

Base substrate 140, barrier 190 and cover structure 160 can define or be referred to as a semiconductor package of semiconductor device 100, and such package can provide protection for electronic devices 110 and 180 and interconnection 130 from external elements and/or environmental exposure. In addition, such semiconductor package can provide electrical coupling between external electrical components (not shown) and external interconnect 1424.

Figure 2:
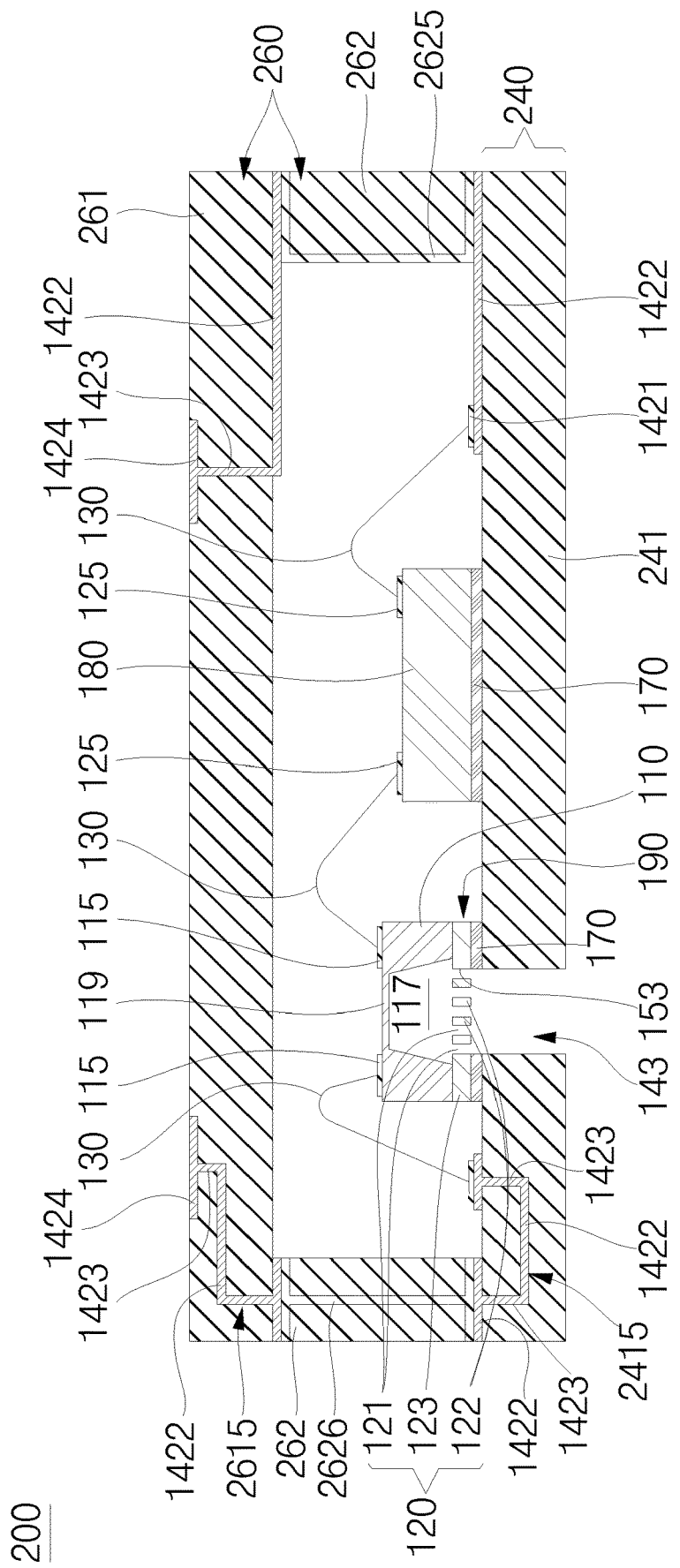
FIG. 2 shows a cross-sectional view of an example semiconductor device.

FIG. 2 shows a cross-sectional view of an example packaged electronic device 200, such as a semiconductor device 200. In the example shown in FIG. 2, semiconductor device 200 can comprise electronic devices 110 and 180, interconnection 130, base substrate 240, barrier 190 and cover structure 260.

Base substrate 240 can be similar to base substrate 140, and can comprise dielectric structure 241 and conductive structure 2415 having base interconnect 1421, trace 1422, via 1423, and passageway 143. Cover structure 260 can comprise cover wall 261 and side wall 262. Cover wall 261 can comprise conductive structure 2615 with trace 1422, via 1423 and external interconnect 1424. Side wall 262 can comprise vertical paths 2625 and 2626. In some examples, vertical paths 2625 and 2626 can electrically connect and/or be interposed between trace 1422 of conductive structure 2415 of base substrate 240, and trace 1422 of conductive structure 2615 of cover wall 261. Base substrate 240 and/or cover structure 260 can be commonly applied to example semiconductor devices disclosed in the present disclosure.

Figure 3:
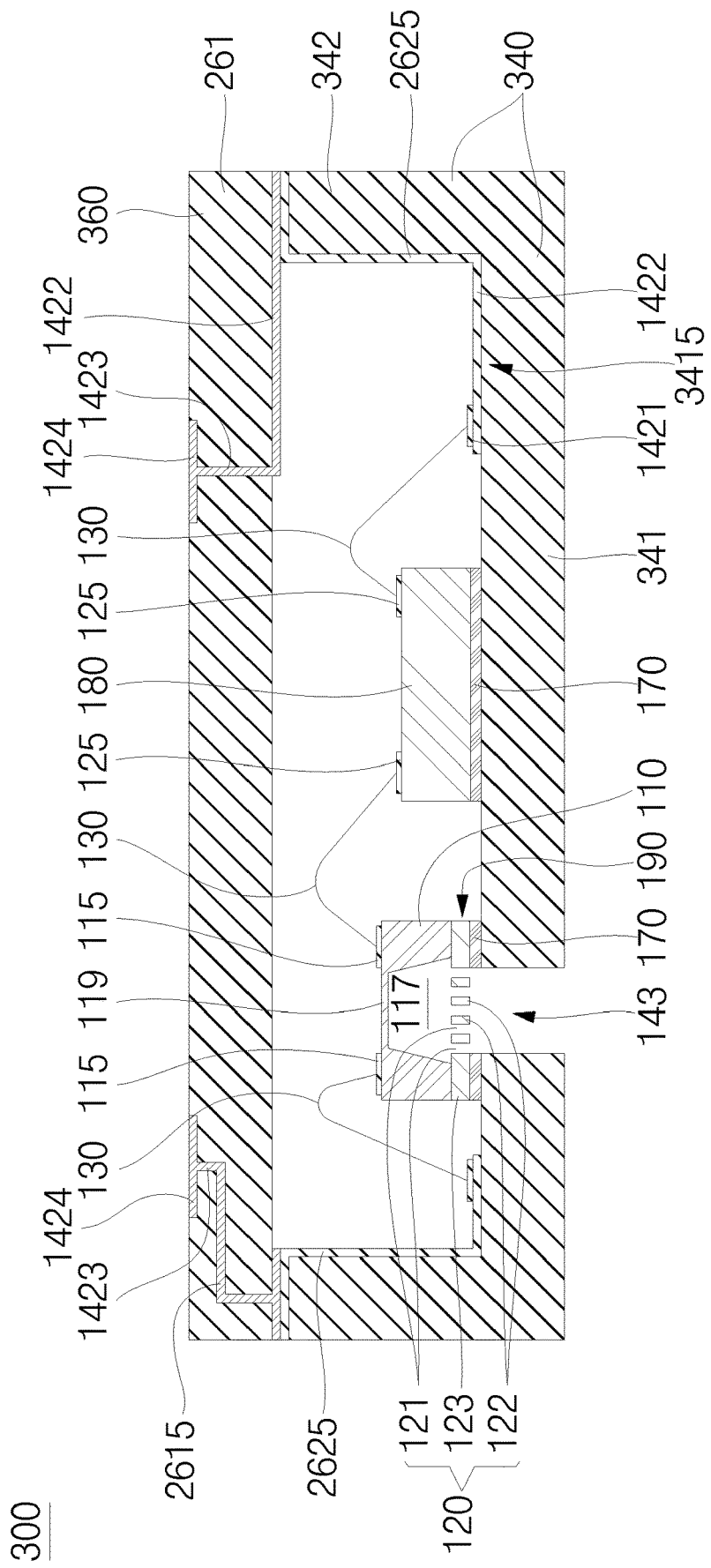
FIG. 3 shows a cross-sectional view of an example semiconductor device.

FIG. 3 shows a cross-sectional view of an example packaged electronic device 300, such as a semiconductor device 300. In the example shown in FIG. 3, semiconductor device 300 can comprise electronic devices 110 and 180, interconnection 130, base substrate 340, barrier 190 and cover structure 360.

Base substrate 340 can comprise bottom wall 341 and side wall 342 as a single integral piece. In some examples, bottom wall 341 can be similar to base substrate 140 and/or 240, and side wall 342 can be similar to side wall 262. Base substrate comprises conductive structure 3415, having base interconnect 1421, trace 1422, and vertical path 2625, and passageway 143. Cover structure 360 can comprise or be similar to cover wall 261, having conductive structure 2615 with trace 1422, via 1423 and external interconnect 1424. Vertical path 2625 of side wall 342 can be interposed between trace 1422 of base substrate 340 and trace 1422 of cover wall 261. Base substrate 340 and/or cover structure 360 can be commonly applied to example semiconductor devices disclosed in the present disclosure.

Figure 4E:
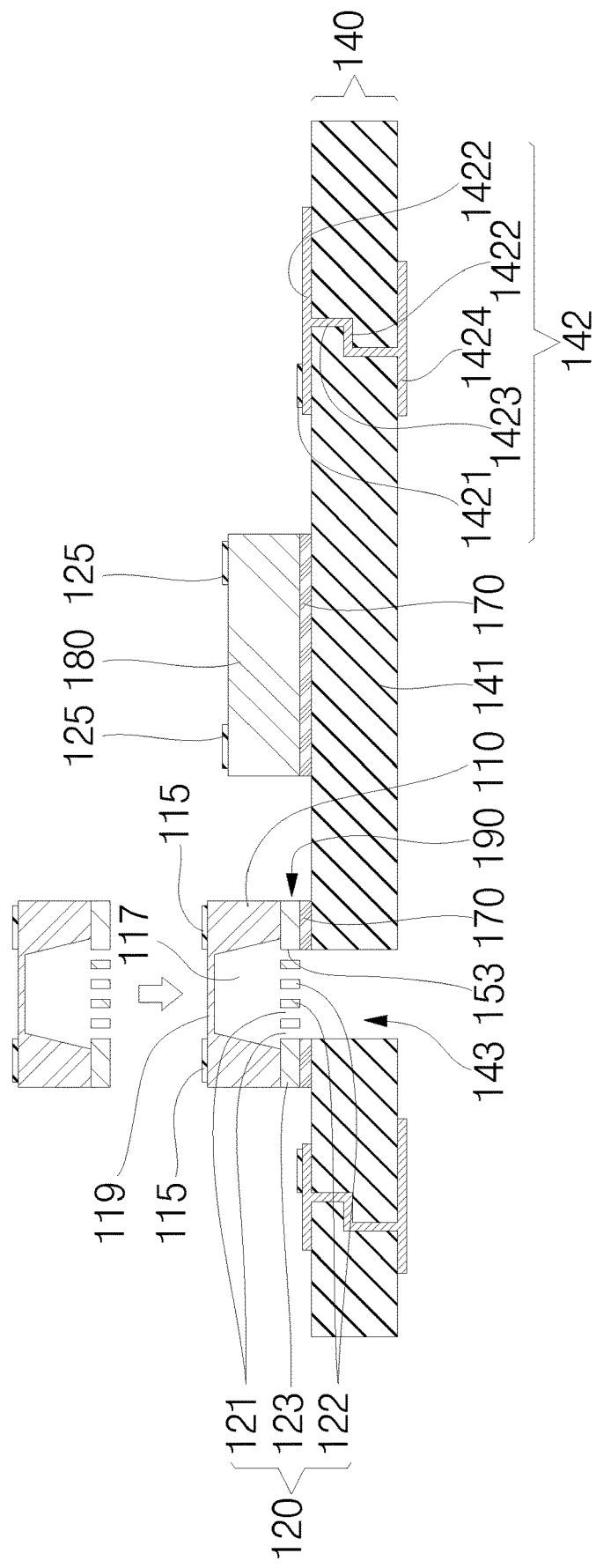

FIGS. 4A to 4G show cross-sectional views of an example method for manufacturing a packaged electronic device, such as a packaged semiconductor device. Some of the elements or steps described with respect to FIGS. 4A to 4G can be compatible with or applicable to the manufacturing of other semiconductor devices described in the present disclosure. FIG. 4A shows a cross-sectional view at an early stage of the method of manufacture.

In the example shown in FIG. 4A, electronic device 110 can comprise a MEMS (Micro-Electro-Mechanical System) sensor. In some examples, MEMS sensor 110 can be referred to as or can comprise an acoustic sensor (e.g., a microphone), an environment sensor (e.g., a pressure sensor or a gas sensor), or a motion sensor (e.g., an accelerometer or a gyro sensor). In some examples, MEMS sensor 110 can comprise silicon, polymer, metal and/or ceramic, and can be a part of a circular or rectangular wafer including a plurality of sensors. For instance, MEMS sensor 110 can comprise a semiconductor die. Three MEMS sensors 110 are illustrated in FIG. 4A side-by-side, but the present disclosure does not limit the number of MEMS sensors 110 to three (3). In other examples, one MEMS sensor 110 or four or more MEMS sensor 110 can be provided. In some examples, MEMS sensor 110 is provided as part of semiconductor substrate, such as a silicon wafer.

Example processes for forming MEMS sensor 110 can comprise a semiconductor manufacturing process, a deposition process, such as physical deposition or chemical deposition, a lithography process, such as photolithography, electron beam lithography, ion beam lithography or X-ray lithography, a patterning process, such as diamond patterning, and/or an etching process. MEMS sensor 110 can have a thickness and a width in a range from approximately 50 microns (micrometers) to approximately 200 microns. In some examples, MEMS sensor 110 can sense external sound, environment or motion and convert the same into an electrical signal to output the electrical signal to an external device and/or electronic device 180.

In some examples, MEMS sensor 110 can comprise device interconnect 115 formed on a first surface. Device interconnect 115 can be referred to as or can comprise a pad, a land or a bump. In some examples, MEMS sensor 110 can comprise a cavity 117 formed on or extending inward from a second surface opposite to the first surface. A depth of cavity 117 can be smaller than the thickness of MEMS sensor 110. Example processes for forming cavity 117 can include anisotropic etching and/or isotropic etching. In some examples, MEMS sensor 110 can comprise a thin diaphragm 119 remaining as a result of forming cavity 117. In some examples, diaphragm 119 can be distorted or bent by external sound, environment or motion, and output voltages and/or resistance values based on diaphragm 119 can vary and be monitored by internal or external circuitry. As will be described later, electronic device 180 can monitor and control MEMS sensor 110.

FIG. 4B shows a cross-sectional view at a later stage of the method of manufacture. In the example shown in FIG. 4B, a layer of materials, such as a dielectric film 120A can be laminated on or adjacent to a surface of MEMS sensor 110, and cavity 117 can be closed off by dielectric film 120A. In some examples, dielectric film 120A can be referred to as or can comprise a polyimide (PI) film, a polyethylene (PE) film, a polypropylene (PP) film, a benzocyclobutene (BCB) film, a polybenzoxazole (PBO) film, a bismaleimide triazine (BT) film, an epoxy resin film, a phenol resin film, a silicone resin film or an acrylate polymer film. Dielectric film 120A can have a thickness in a range from approximately 1 micron to approximately 10 microns.

FIG. 4C shows a cross-sectional view at a later stage of the method of manufacture. In the example shown in FIG. 4C, multiple openings, such as barrier through-holes 121 are formed in thin dielectric film 120A, defining barrier 190. In some examples, barrier 190 can be referred to as or can comprise a membrane 120, a thin film or a selective barrier. In some examples, membrane 120 can comprise a barrier through-hole 121, barrier strand structures 122 and a barrier body 123. Barrier strand structures are disposed within barrier through-hole 121 to subdivide barrier through-hole 121 into a plurality of openings. This reduces the amount of open area within barrier through-hole 121. Barrier body 123 of membrane 120 can be attached to MEMS sensor 110. In some examples, cavity 117 and diaphragm 119 of MEMS sensor 110 can communicate with the outside environment through multiple barrier through-holes 121 formed in membrane 120. In some examples, diaphragm 119 of MEMS sensor 110 can be distorted or bent by an external force (e.g., air pressure) acting upon multiple barrier through-holes 121 formed in membrane 120. However, the sizing of barrier through-holes 121 is limited such that barrier strand structures 122 would restrict foreign materials from reaching diaphragm 119 or cavity 117. Barrier through-hole 121 and/or barrier strand structures 122 can have a diameter, a width and/or a pitch in a range from approximately 1 micron to approximately 10 microns.

FIG. 4D shows a cross-sectional view at a later stage of the method of manufacture. In the example shown in FIG. 4D, MEMS sensor 110 and barrier 190 can be subjected to singulation together while attached to carrier substrate, such as a mounting film 901 attached to a frame, defining independent MEMS sensors 110 with each having a corresponding barrier 190. In some examples, device interconnect 115 and diaphragm 119 of MEMS sensor 110 can be directly attached onto mounting film 901.

FIG. 4E shows a cross-sectional view at a later stage of the method of manufacture. In the example shown in FIG. 4E, MEMS sensor 110 having barrier 190 can be attached to base substrate 140. In some examples, MEMS sensor 110 can be attached to base substrate 140 by adhesive 170. In some examples, electronic device 180 can be attached to base substrate 140 before or after attachment of MEMS sensor 110. In some examples, electronic device 180 can be attached to base substrate 140 by adhesive 170.

In some examples, electronic device 180 can be referred to as or can comprise a controller device, a logic die, a memory, a digital signal processor, a network processor, a power management unit, an audio processor, an RF circuit, a wireless baseband system on chip processor or an application specific integrated circuit (ASIC). Controller device 180 can comprise device interconnect 125 formed on its surface. Device interconnect 125 can be referred to as or can comprise a pad, a land or a bump. Controller device 180 can have a thickness in a range from approximately 50 microns to approximately 200 microns. Controller device 180 can process an electrical signal input from MEMS sensor 110 and output results from such processing to an external device.

In some examples, MEMS sensor 110 having barrier 190 can be attached to a peripheral portion of a region corresponding to passageway 143 of base substrate 140. In some examples, barrier 190 can be adhered to base substrate 140 by adhesive 170. In some examples, barrier body 123 of barrier 190 can be adhered to a predetermined region of base substrate 140 disposed outside passageway 143 by adhesive 170.

Base substrate 140 can be shaped as a substantially planar panel having passageway 143. In some examples, passageway 143 can have a diameter in a range from approximately 1 micron to approximately 50 microns. External force or pressure can be transferred to MEMS sensor 110 through passageway 143 provided in base substrate 140. Base substrate 140 can be referred to as or can comprise a laminate substrate, a circuit board or a wiring board. Base substrate 140 can comprise dielectric structure 141 and conductive structure 142. In some examples, dielectric structure 141 can be referred to as or can comprise $Si_3N_4$, $SiO_2$, SiON, polyimide (PI), benzocyclobutene (BCB), polybenzoxazole (PBO), bismaleimide triazine (BT), epoxy resin, phenol resin, silicone resin or acrylate polymer. Dielectric structure 141 can have a thickness in a range from approximately 50 microns to approximately 1000 microns. Dielectric structure 141 can support MEMS sensor 110, controller device 180 and conductive structure 142, and can prevent electrical shorts from occurring. Conductive structure 142 can be referred to as or can comprise a circuit pattern or a wiring pattern. Conductive structure 142 can comprise base interconnect 1421 and trace 1422 formed on a first surface of dielectric structure 141. In addition, base interconnect 1421 can be referred to as or can comprise a pad, a land or an under-bump metallization (UBM). In addition, conductive structure 142 can further comprise external interconnect 1424 formed on a second surface opposite to the first surface. External interconnect 1424 can be referred to as or can comprise a pad, a land or a bump. Moreover, conductive structure 142 can further comprise at least one via 1423 and/or at least one trace 1422. As an example, the at least one via 1423 can connect trace 1422 and external interconnect 1424 to each other. Via 1423 and/or trace 1422 can be formed inside dielectric structure 141. In some examples, conductive structure 142 can comprise titanium, tungsten, titanium/tungsten, copper, gold, silver, palladium and/or nickel. In addition, conductive structure 142 can have a thickness and a width in a range from approximately 2 microns to approximately 20 microns. Conductive structure 142 can electrically connect MEMS sensor 110 and controller device 180 to an external device including, for example, a next level of assembly, such as printed circuit board or another electronic device.

Figure 4F:
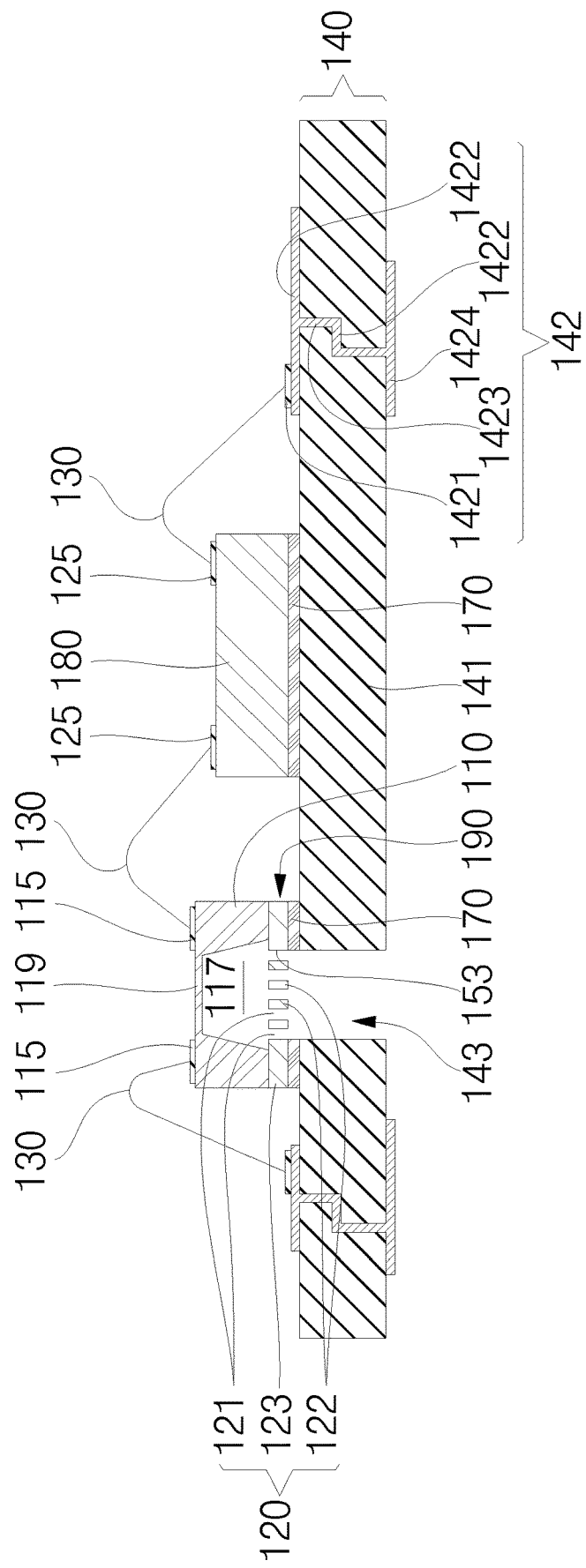

FIG. 4F shows a cross-sectional view of at a later stage of the method of manufacture. In the example shown in FIG. 4F, device interconnect 115 of MEMS sensor 110 and base interconnect 1421 of base substrate 140 can be connected to each other by interconnection 130. Interconnection 130 can be referred to as or can comprise a wire bond. In addition, device interconnect 125 of controller device 180 and base interconnect 1421 of base substrate 140 can be electrically connected to each other by interconnection 130. In some examples, interconnection 130 can directly electrically connect device interconnect 115 of MEMS sensor 110 and interconnect 125 of controller device 180 to each other.

In some examples, interconnection 130 can be referred to as or can comprise a gold wire, a silver wire, a copper wire or an aluminum wire. Interconnection 130 can have a diameter in a range from approximately 1 micron to approximately 20 microns.

In some examples, controller device 180 can be attached to base substrate 140 in a flip-chip configuration. In the flip-chip example, controller device 180 can be electrically connected to base interconnect 1421 by an interconnection like a bump, a pillar, a post (not shown), or other connective structures as known to one of ordinary skill in the art.

Figure 4G:
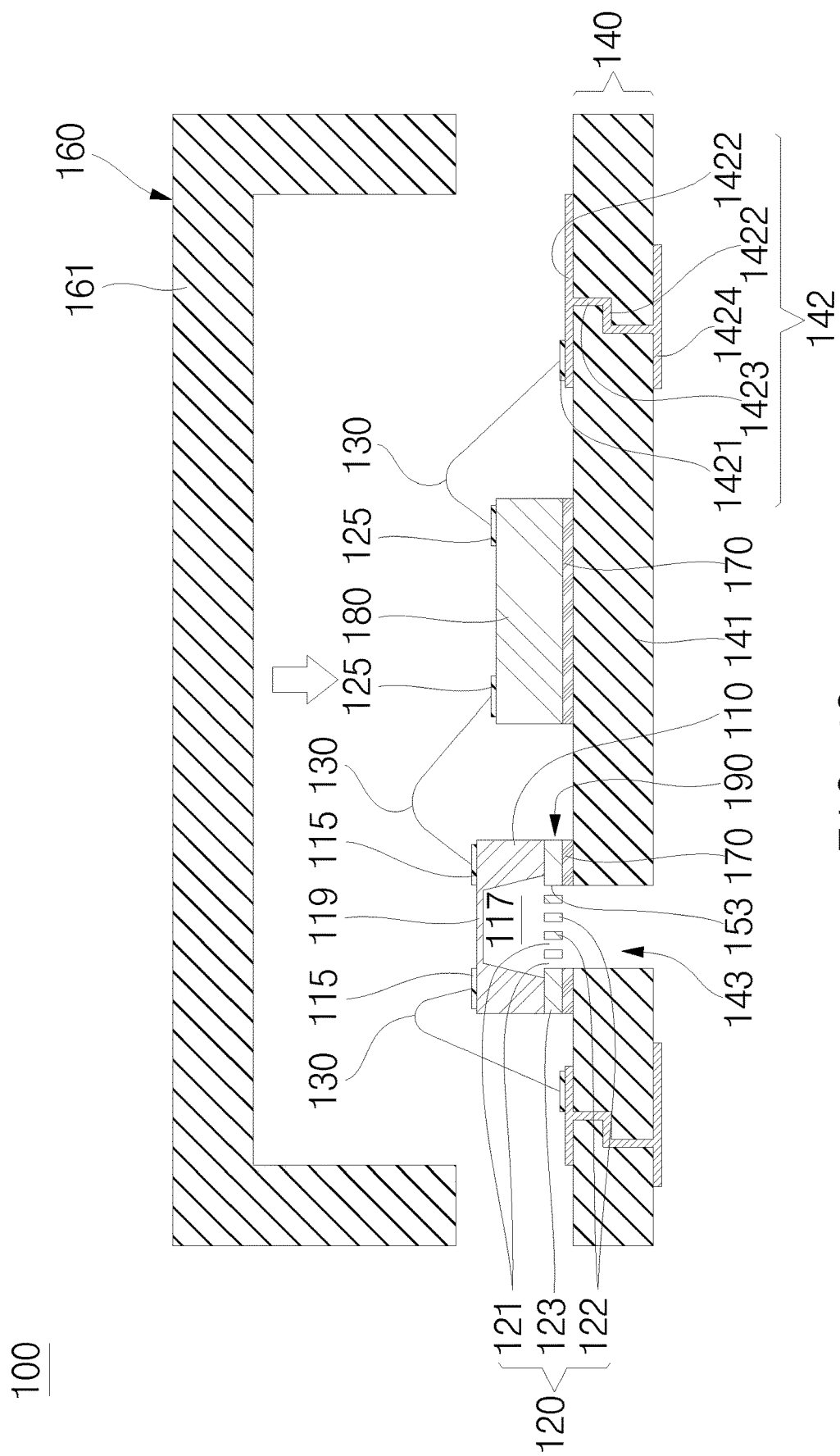

FIG. 4G shows a cross-sectional view at a later stage of the method of manufacture. Semiconductor device 100 can be defined at this stage, having cover structure 160 attached to base substrate 140 while covering MEMS sensor 110 and controller device 180. Cover structure 160 can comprise top wall 161 and side wall 162 attached to a surface of base substrate 140. In some examples, side wall 162 can be attached to surface of base substrate 140 by an adhesive. In some examples, cover structure 160 can be referred to as or can comprise a lid, a cover, a seal or a protective body. In addition, in some examples, cover structure 160 can be referred to as or can comprise polyimide (PI), benzocyclobutene (BCB), polybenzoxazole (PBO), bismaleimide triazine (BT), epoxy resin, phenol resin, silicon resin, acrylate polymer, metal or ceramic. Cover structure 160 can have a thickness in a range from approximately 50 microns to approximately 1000 microns. In addition, cover structure 160 can have a height in a range from approximately 500 microns to approximately 5000 microns. Cover structure 160 can protect MEMS sensor 110, controller device 180 and interconnection 130 from external elements and/or environmental exposure.

Figure 5:
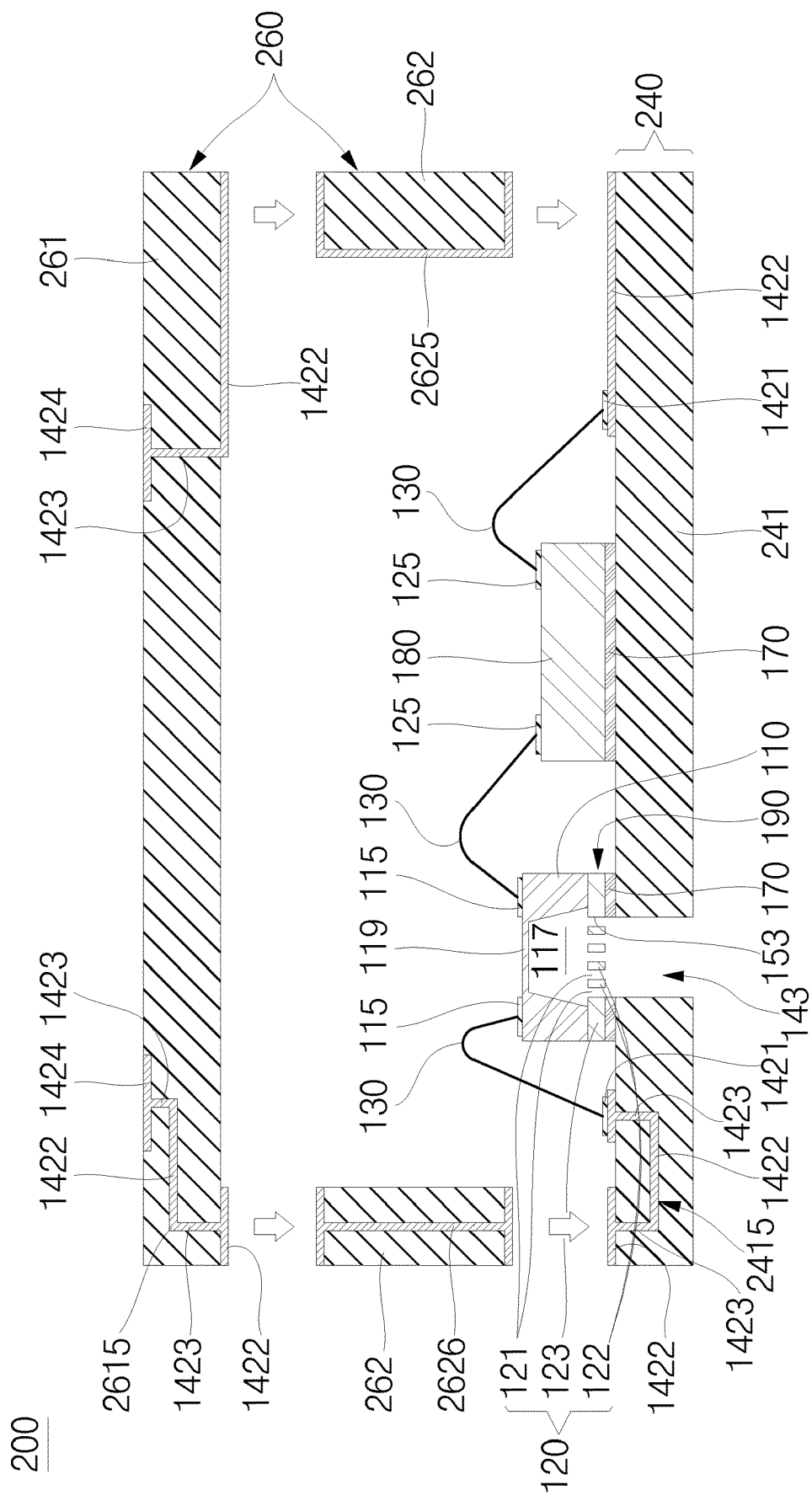
FIG. 5 shows cross-sectional views of an example method for manufacturing an example semiconductor device.

FIG. 5 shows cross-sectional views of an example method for manufacturing an example semiconductor device 200. In some examples, prior to reaching the stage depicted in FIG. 5, the method can comprise one or more stages similar to those described above with respect to FIGS. 4A-4F. In the example shown in FIG. 5, cover wall 261 can be attached to side wall 262, and side wall 262 can be attached to base substrate 240. In some examples, side wall 262 can be attached to base substrate 240, and cover wall 261 can be attached to side wall 262. In some examples, cover wall 261 and side wall 262 can be referred to as a cover structure 260.

In some examples, each of cover wall 261 and/or side wall 262 can be referred to as or can comprise a laminate substrate, a circuit board or a wiring board. Cover wall 261 and/or side wall 262 can comprise characteristics similar to those described above with respect to base substrate 140 and 240. For example, a dielectric material of cover wall 261 and/or side wall 262 can comprise $Si_3N_4$, $SiO_2$, SiON, $Si_3N_4$, $SiO_2$, SiON, polyimide (PI), benzocyclobutene (BCB), polybenzoxazole (PBO), bismaleimide triazine (BT), epoxy resin, phenol resin, silicone resin or acrylate polymer. Each of cover wall 261 and side wall 262 can have a thickness in a range from approximately 50 microns to approximately 1000 microns. Cover wall 261 can comprise trace 1422 formed on a first surface, external interconnect 1424 formed on a second surface opposite to first surface, and at least one via 1423 connecting trace 1422 and external interconnect 1424 to each other, and/or trace 1422. External interconnect 1424 can be referred to as or can comprise a pad, a land or a bump. Via 1423 and/or trace 1422 can be formed in an interior side of cover wall 261. In some examples, trace 1422, external interconnect 1424 and via 1423 can comprise titanium, tungsten, titanium/tungsten, copper, gold, silver, palladium and/or nickel. In addition, trace 1422, external interconnect 1424 and via 1423 can have a thickness and a width in a range from approximately 2 microns to approximately 20 microns.

Side wall 262 can comprise vertical path 2625 formed on its one surface. Vertical path 2625 can be referred to as or can comprise a side wall surface passageway or trace. In addition, side wall 262 can comprise vertical path 2626 traversing. Vertical path 2626 can be referred to as or can comprise a side wall embedded passageway or trace. Side wall 262 can have a height in a range from approximately 500 microns to approximately 5000 microns.

In some examples, vertical paths 2625 and 2626 can be electrically connected to trace 1422 provided in cover wall 261 directly or through a conductive adhesive. In some examples, vertical paths 2625 and 2626 can be electrically connected to trace 1422 provided in base substrate 240 directly or through a conductive adhesive. In some examples, conductive adhesive can be referred to as or can comprise a conductive paste, a solder paste, a silver filled epoxy or an anisotropic conductive film.

Figure 6:
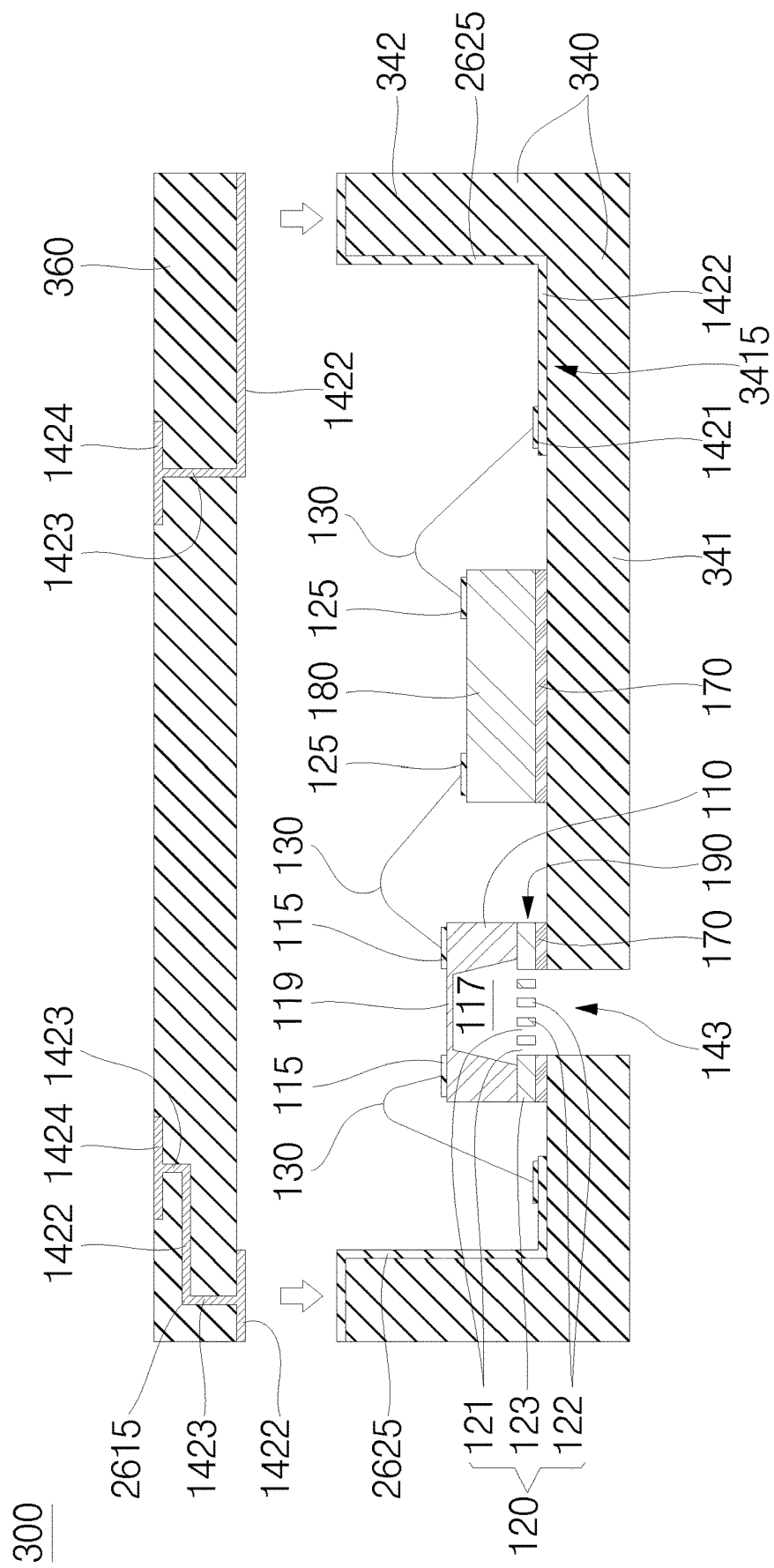
FIG. 6 shows cross-sectional views of an example method for manufacturing an example semiconductor device.

FIG. 6 shows cross-sectional views of an example method for manufacturing example semiconductor device 300. In some examples, prior to reaching the stage depicted in FIG. 6, the method can comprise one or more stages similar to those described above with respect to FIGS. 4A-4F. In the example shown in FIG. 6, cover structure 360 can be attached to side wall 342 of base substrate 340. In some examples, trace 1422 of cover structure 360 can be electrically connected to vertical path 2625 provided in side wall 342 directly or through a conductive adhesive.

Figure 7:
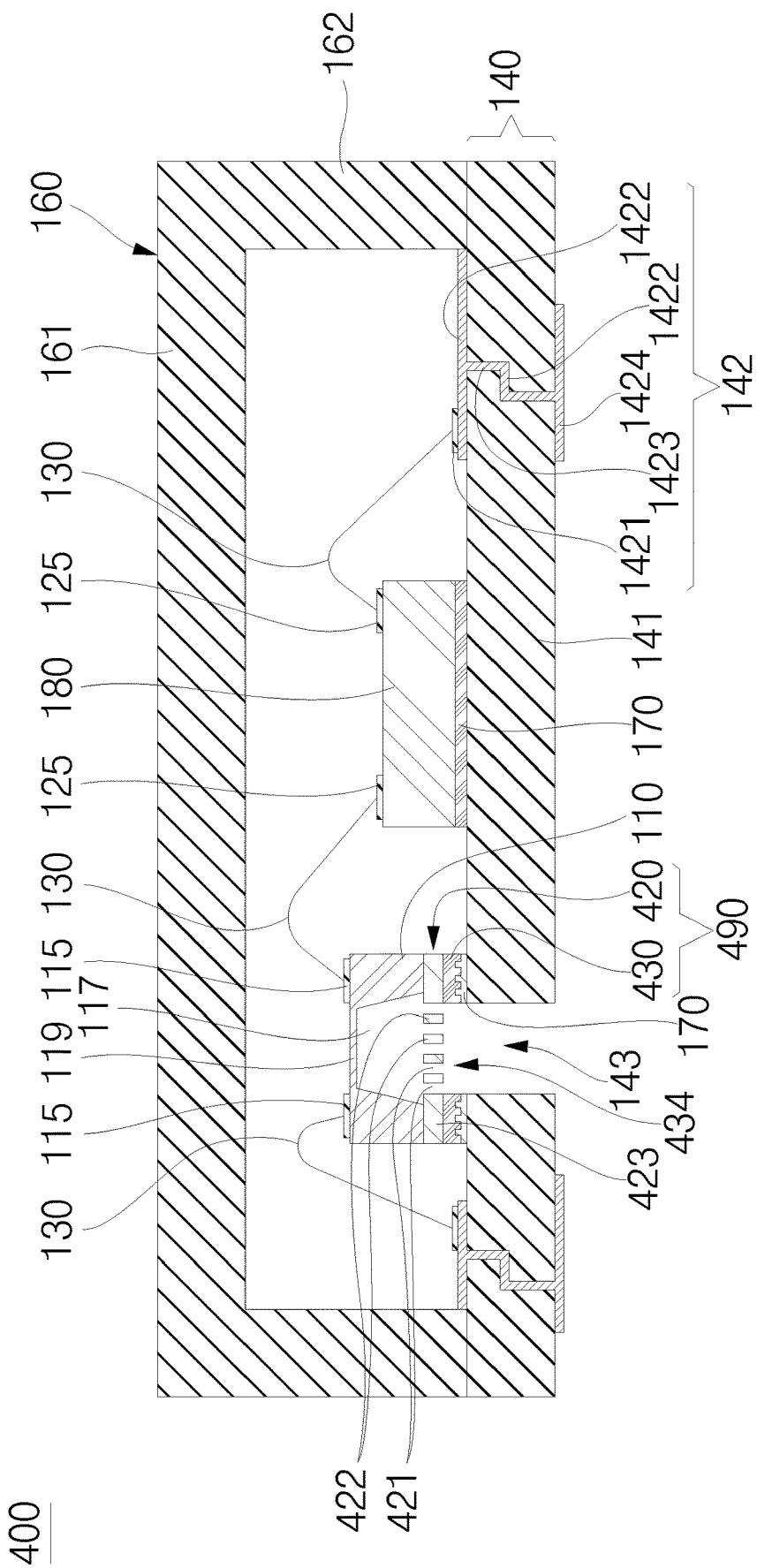
FIG. 7 shows a cross-sectional view of an example semiconductor device.

FIG. 7 shows a cross-sectional view of an example semiconductor device 400. Corresponding features or elements of semiconductor device 400 can be similar to those described above with respect to semiconductor device 100, 200, and/or 300. In the example shown in FIG. 7, semiconductor device 400 can comprise electronic devices 110 and 180, interconnection 130, base substrate 140, barrier 490, and cover structure 160.

Barrier 490 can be similar to barrier 190 and can comprise membrane 420 and stiffener 430. Membrane 420 can comprise through-holes 421, barrier strands 422, and barrier body 423. In addition, stiffener 430 can comprise through-hole 434. Through-holes 421 and barrier strands 422 provided in membrane 420, and through-hole 434 provided in stiffener 430, can be aligned with passageway 143 provided in dielectric structure 141. In addition, barrier 490 can be interposed between MEMS sensor 110 and base substrate 140. In some examples, adhesive 170 can be interposed between barrier 490 and base substrate 140.

Figure 8A:
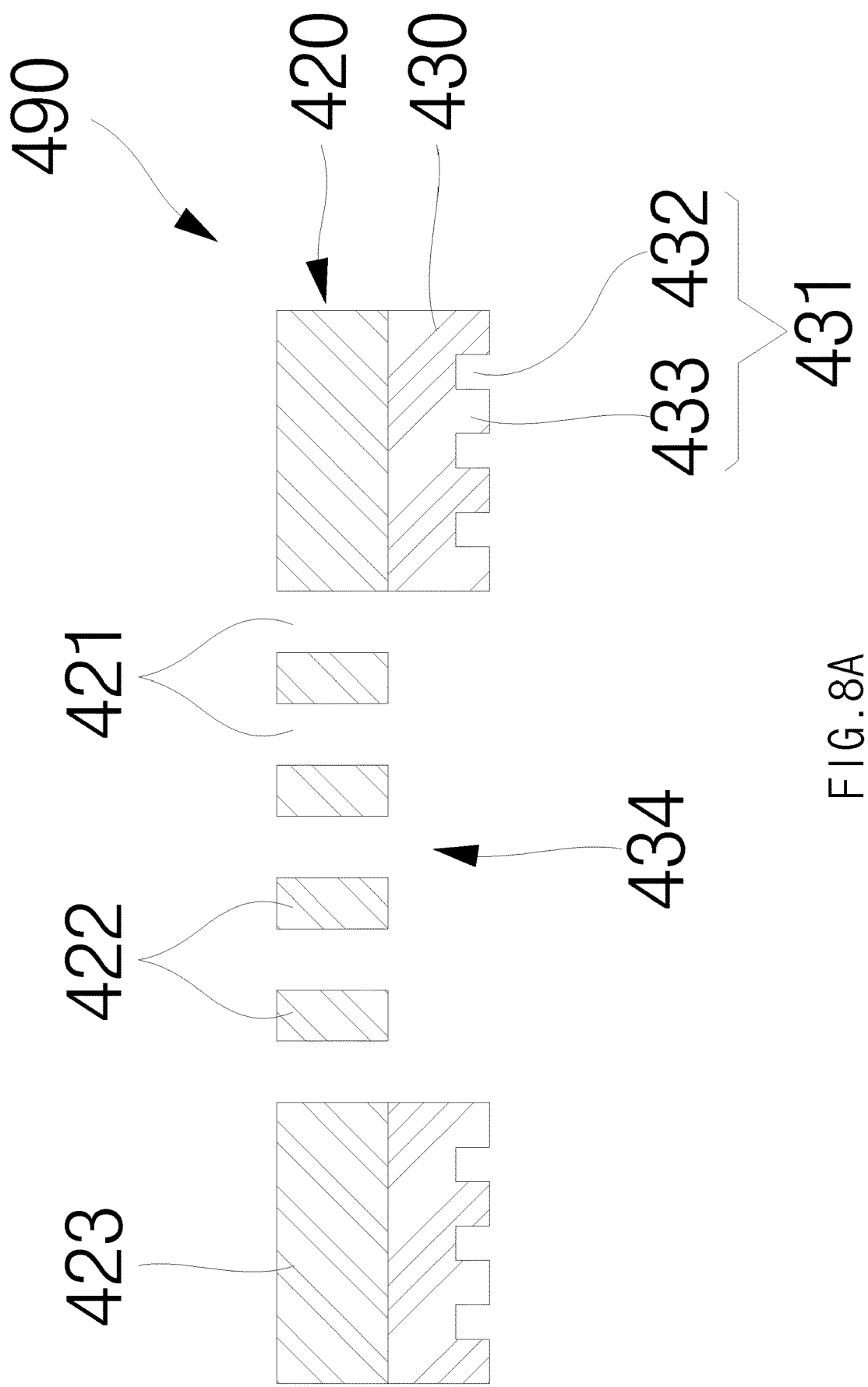
FIG. 8A is an enlarged cross-sectional view of an example barrier.
Figure 8B:
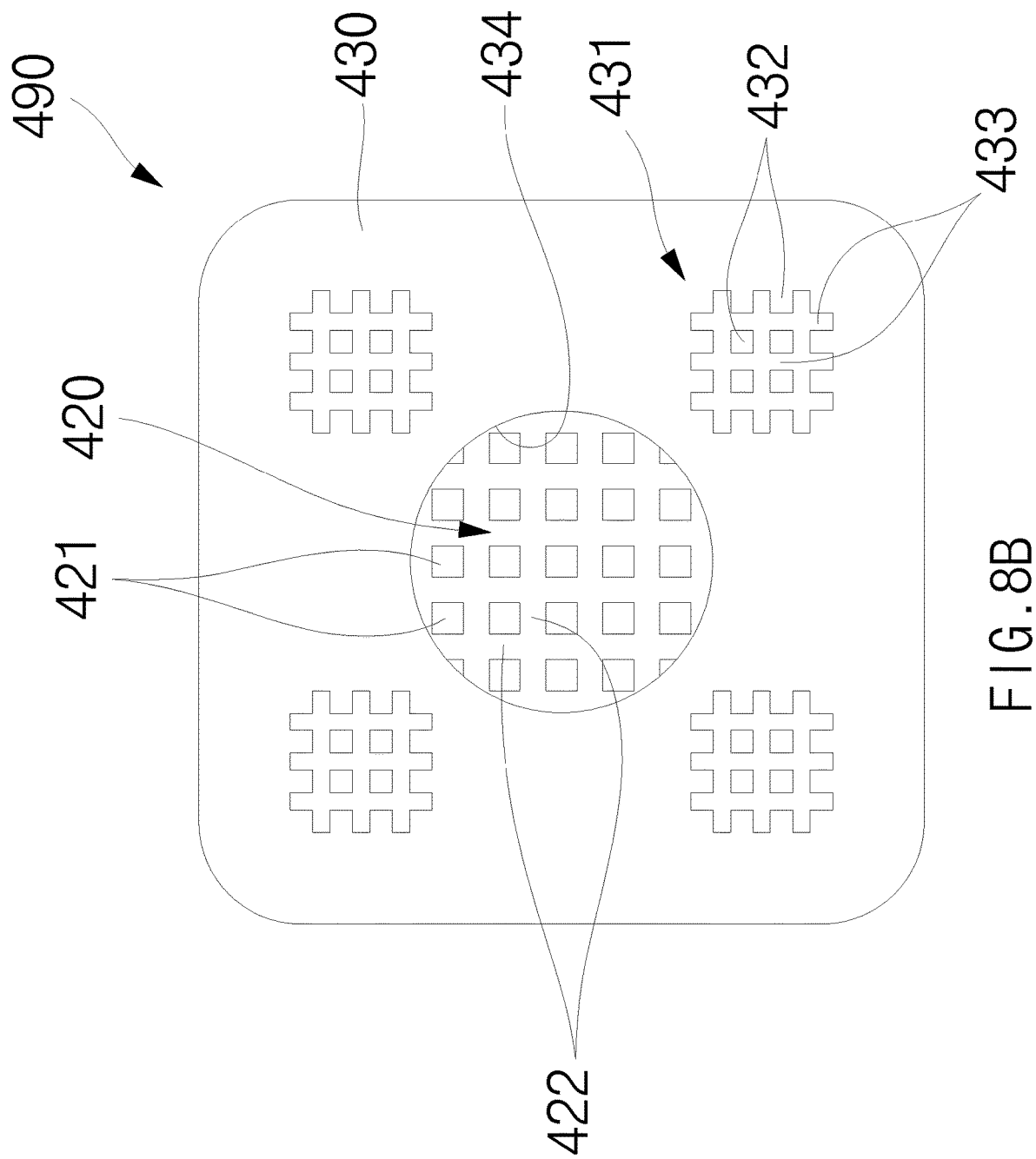
FIG. 8B is a bottom view of the example barrier of FIG. 8A.

FIG. 8A is an enlarged cross-sectional view of example barrier 490 and FIG. 8B is a bottom view of example barrier 490. In examples shown in FIGS. 8A and 8B, barrier 490 can comprise membrane 420 and stiffener 430. As described above, barrier 490 can also comprise through-holes 421, barrier strands 422, and barrier body 423, and stiffener 430 can comprise one or more protrusion patterns 431 and through-hole 434. In some examples, membrane 420 comprising through-holes 421, barrier strands 422, and barrier body 423 can be similar to membrane 120 in view of configuration, material and/or thickness.

In some examples, barrier body 423 of membrane 420 can be coupled with a first surface of stiffener 430, and protrusion pattern 431 can be provided on a second surface opposite to the first surface. As illustrated in FIG. 8A, protrusion pattern 431 includes an outer surface or an outward facing surface that has a non-planar shape. In some examples, protrusion pattern 431 can comprise recesses or recess portions 432 and protrusions or protrusion portions 433. In some examples, when planarly viewed, recesses 432 and protrusions 433 can be formed in a substantially checkered pattern. In some examples, protrusion patterns 431 can be formed roughly at four corners or four sides of stiffener 430. In some examples, one or more protrusion patterns 431 can be formed along the whole outer perimeter (for example, four corners and four sides) of through-hole 434. Protrusion pattern 431 is an example where the protrusion pattern is integral with the stiffener.

During the manufacture of barrier 490, adhesion between stiffener 430 and mounting film 901 can be lowered by forming protrusion patterns 431 on a bottom surface of stiffener 430 to reduce the bottom surface area available for adhesion with mounting film 901, which better facilitates separation of barrier 490 from mounting film 901. In some examples, mounting film 901 can comprise a semi-rigid adhesive or an adhesive having a high viscosity. In addition, when adhesive 170 is later used to attach barrier 410 to base substrate 140, adhesive 170 can be absorbed into increased adhesion area defined by recesses 431 and protrusions 433 of protrusion patterns 431 formed on stiffener 430, increasing adhesion between barrier 410 and base substrate 140. In some examples, adhesive 170 can comprise a liquid adhesive or an adhesive having a low viscosity.

Figure 9:
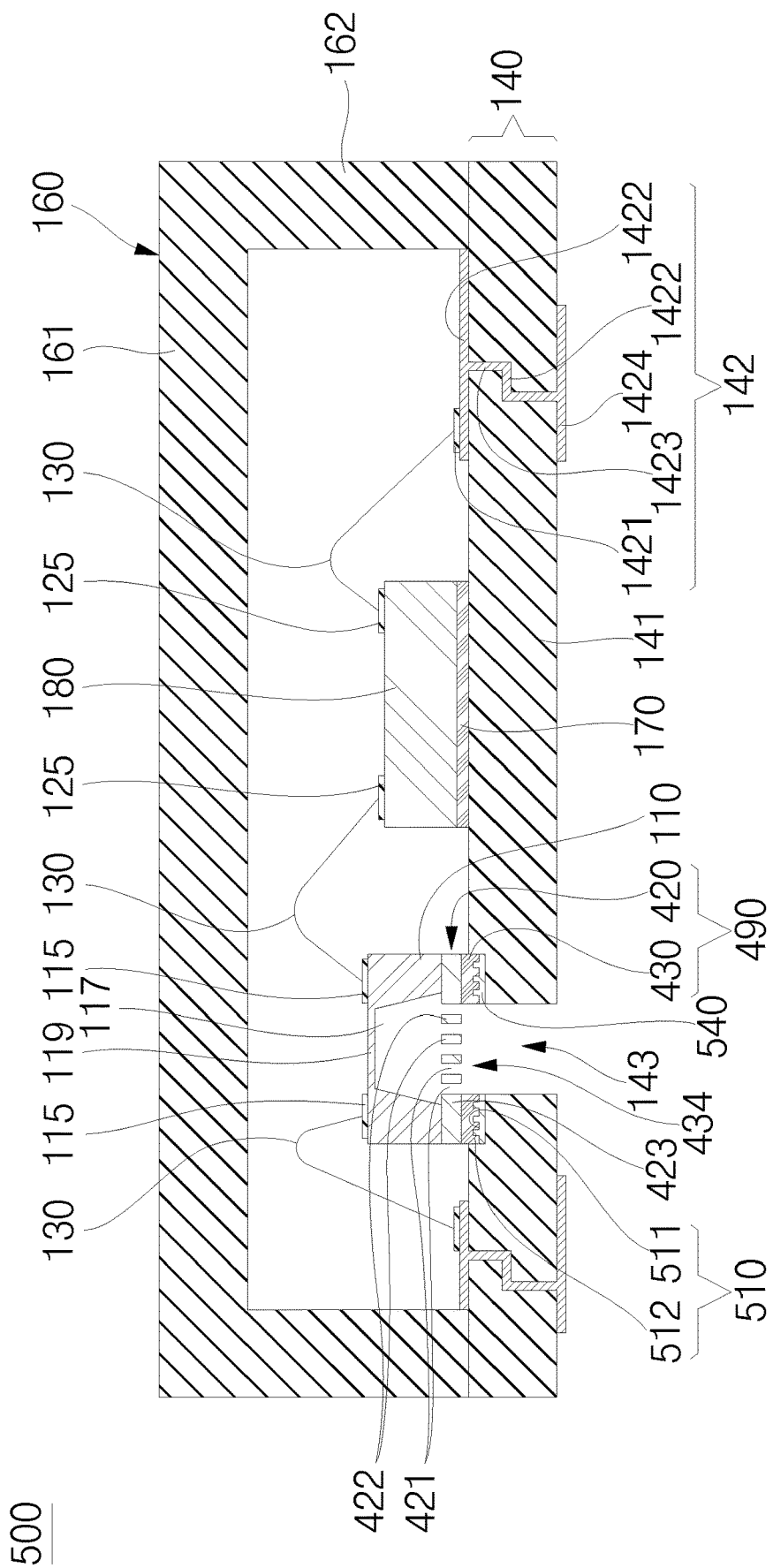
FIG. 9 shows a cross-sectional view of an example semiconductor device.

FIG. 9 shows a cross-sectional view of an example semiconductor device 500, which can be similar to semiconductor device 100. In the example shown in FIG. 9, semiconductor device 500 can comprise trench 510 or recessed regions 510 formed in base substrate 140. In some examples, trench 510 can be formed at a region around a perimeter of passageway 143. In some examples, trench 510 can have a greater diameter than passageway 143.

Trench 510 can have bottom 511 and side wall 512. Barrier 490 can be adhered to bottom 511 of trench 510 by adhesive 540. In some examples, barrier 490 can contact and/or can be adhered to side wall 512 of trench 510. In some examples, trench 510 can have a smaller or larger depth than a thickness of barrier 490. In some examples, trench 510 can have a smaller or larger depth than a thickness of stiffener 430. In some examples, the depth of trench 510 can be smaller than a sum of thickness of barrier 490 and thickness of MEMS sensor 110. Trench 510 formed in base substrate 140 and barrier 490 adhered to trench 510 can be commonly applied to example semiconductor devices disclosed in the present disclosure.

Figure 10:
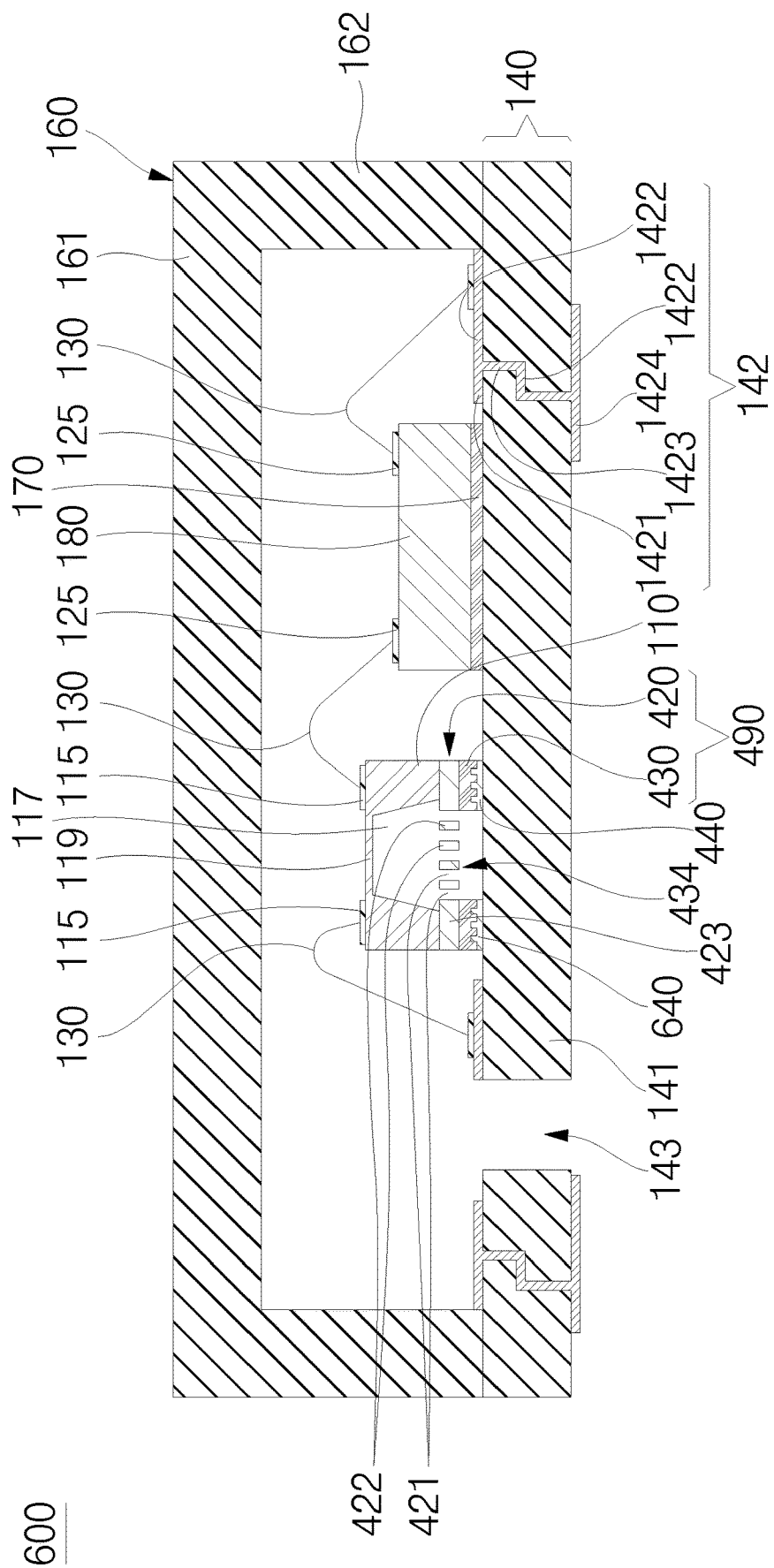
FIG. 10 shows a cross-sectional view of an example semiconductor device.

FIG. 10 shows a cross-sectional view of an example semiconductor device 600, which can be similar to semiconductor device 100. In the example shown in FIG. 10, semiconductor device 600 can comprise MEMS sensor 110 attached laterally from passageway 143 formed in base substrate 140. In some examples, MEMS sensor 110 can be attached to a planar region not corresponding to passageway 143 by adhesive 640. Accordingly, a pressure passing through passageway 143 can be indirectly applied to MEMS sensor 110. In some examples, barrier 490 can provide a buffer space to MEMS sensor 110. MEMS sensor 110 connected to planar region of base substrate 140 not corresponding to passageway 143 can be commonly applied to example semiconductor devices disclosed in the present disclosure.

FIG. 11A to 11I show cross-sectional views of an example method for manufacturing example barrier 490. In some examples, barrier 490 disclosed can be applied to one or more of the semiconductor devices and/or MEMS devices described in the present disclosure.

Figure 11A:
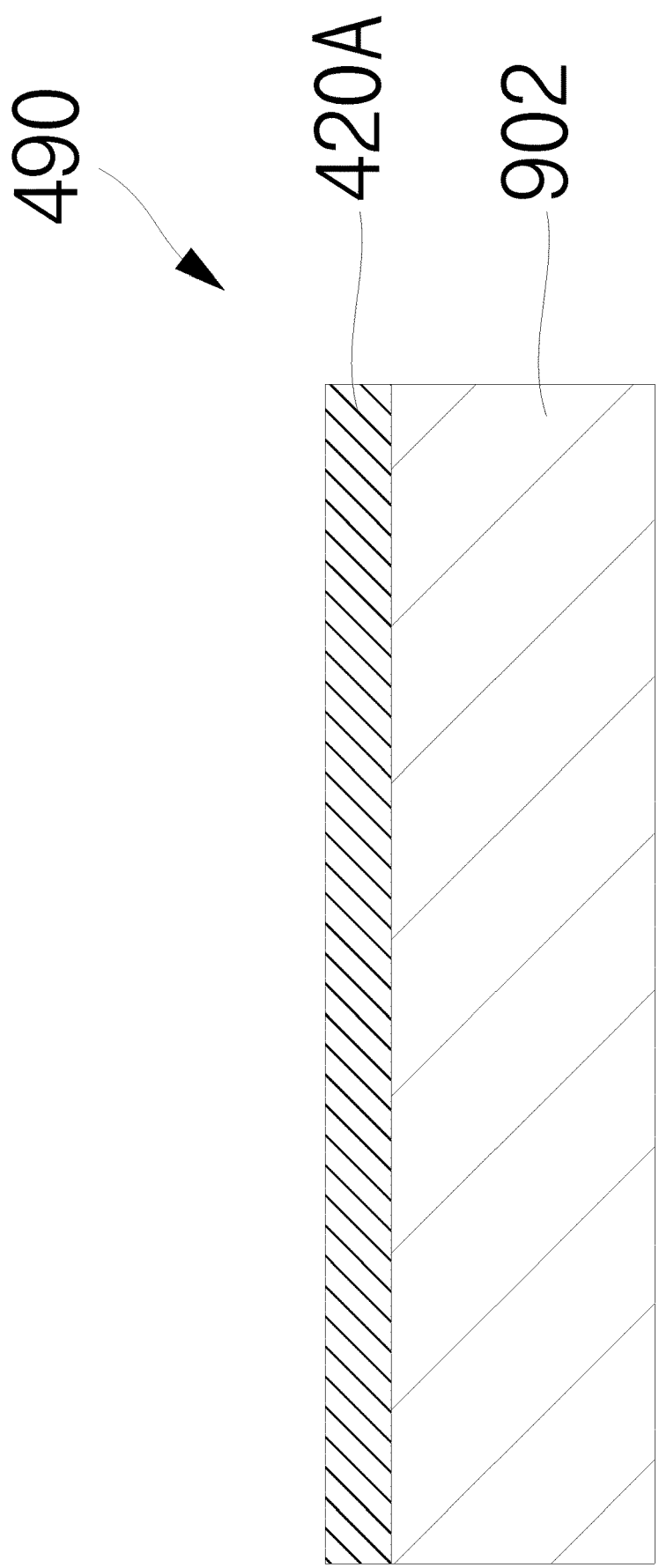

FIG. 11A shows a cross-sectional view of barrier 490 at an early stage of manufacture. In the example shown in FIG. 11A, dielectric structure 420A can be formed on planar base 902. In some examples, planar base 902 can be referred to as or can comprise glass, ceramic, a metal or a low-grade wafer. In some examples, dielectric structure 420A can be referred to as or can comprise $Si_3N_4$, $SiO_2$, SiON, polyimide (PI), polypropylene (PP), polyethylene (PE), benzocyclobutene (BCB), polybenzoxazole (PBO), bismaleimide triazine (BT), epoxy resin, phenol resin, silicone resin or acrylate polymer. In some examples, dielectric structure 420A can be formed by any one of a variety of processes including PVD, CVD, MOCVD, ALD, LPCVD, PECVD, printing, spin coating, spray coating, sintering or thermal oxidation. In some examples, dielectric structure 420A can have a thickness in a range from approximately 1 micron to approximately 10 microns.

Figure 11B:
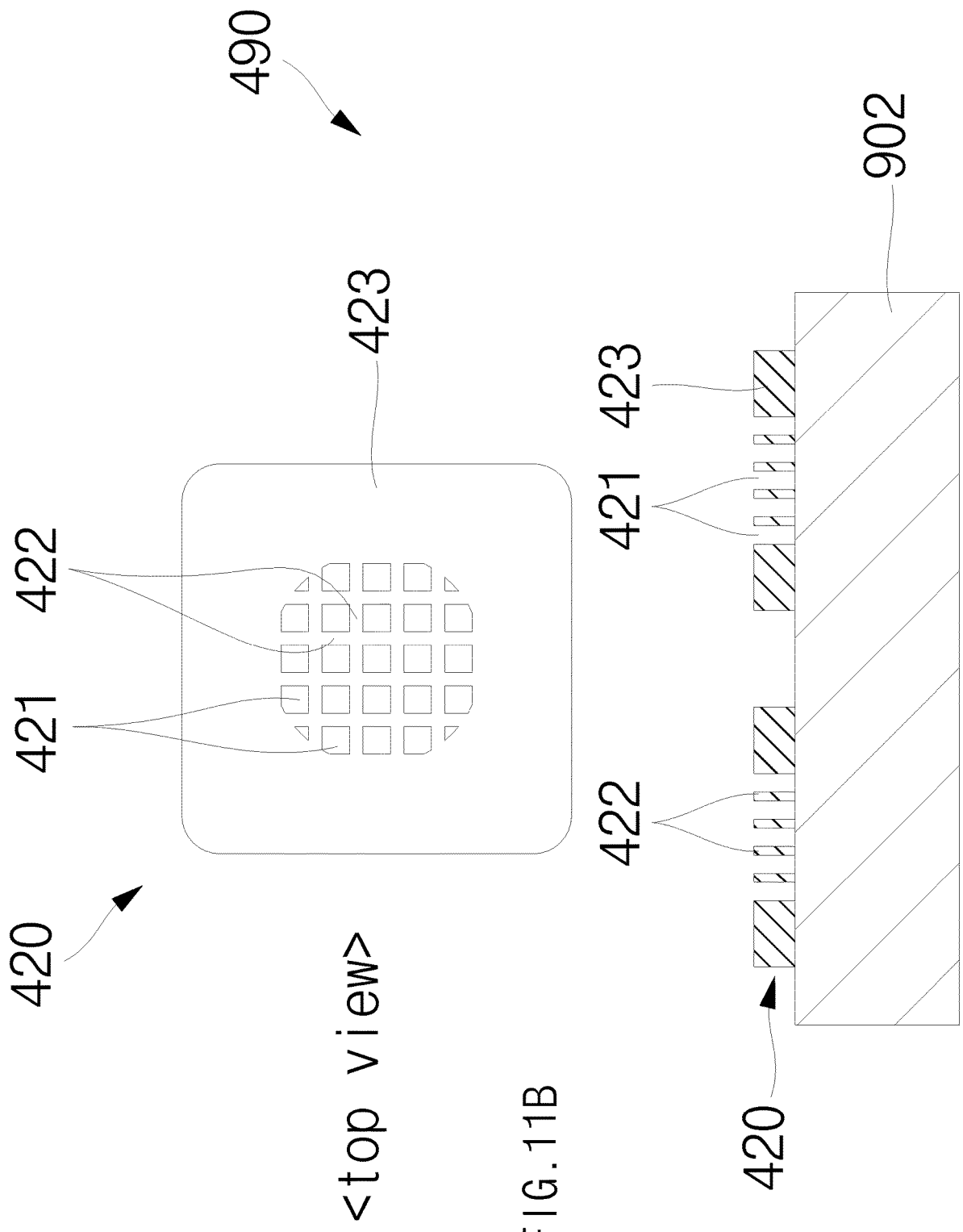

FIG. 11B shows a cross-sectional view and a top view of barrier 490 at a later stage of manufacture. In the example shown in FIG. 11B, a patterning process can be performed on dielectric structure 420A, forming membrane 420 comprising through-holes 421, barrier strands 422, and barrier body 423. In some examples, membrane 420 can be formed from dielectric structure 420A by, for example, a deposition process, such as physical deposition or chemical deposition of photoresist, a lithography process performed on photoresist, such as photolithography, electron beam lithography, ion beam lithography or X-ray lithography, a patterning process, such as diamond patterning, and/or an etching process performed on dielectric structure 420A. Through-holes 421 can have a diameter and/or a pitch in a range from approximately 1 micron to approximately 10 microns. The pitch can vary within a particular structure. In addition, barrier strands 422 can have a width and/or a pitch in a range from approximately 1 micron to approximately 10 microns.

Figure 11C:
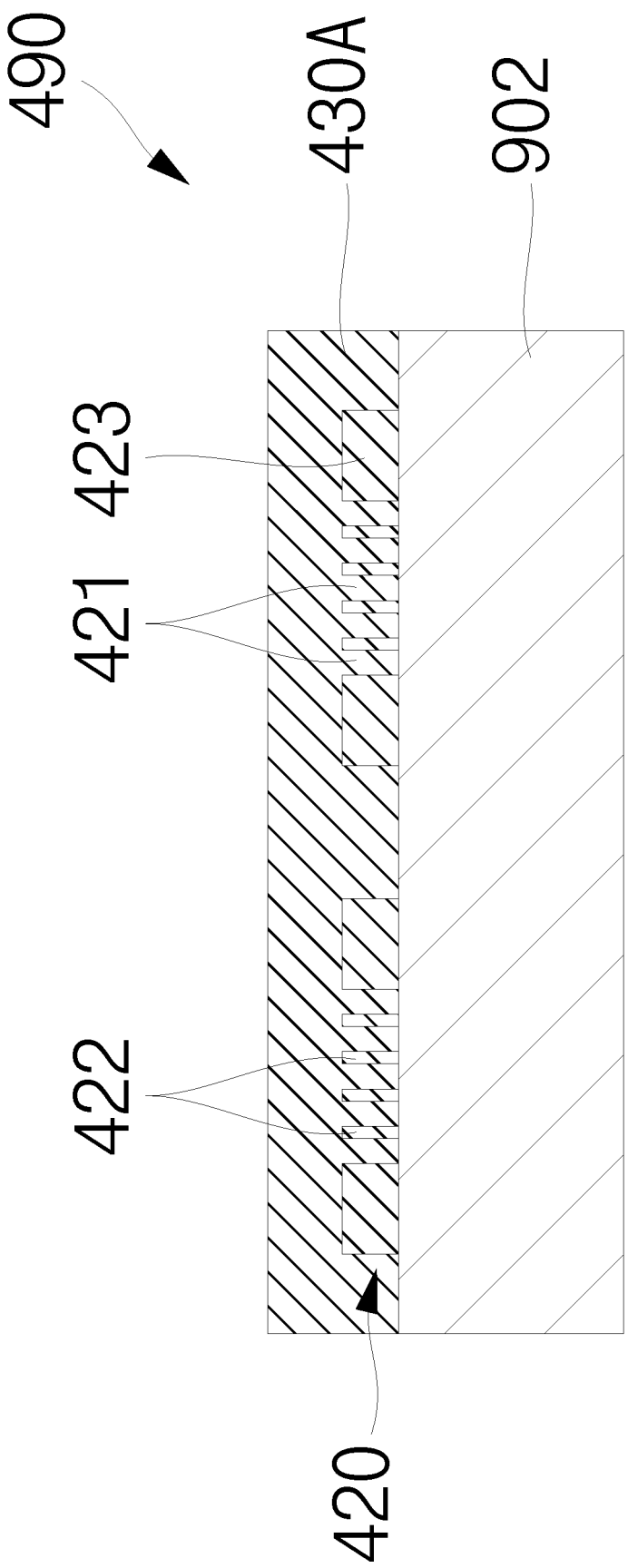

FIG. 11C shows a cross-sectional view of barrier 490 at a later stage of manufacture. In the example shown in FIG. 11C, membrane 490 can be covered by dielectric structure 430A. In some examples, dielectric structure 430A can cover through-holes 421, barrier strands 422, and barrier body 423 of membrane 420.

In some examples, dielectric structure 430A can be referred to as or can comprise $Si_3N_4$, $SiO_2$, SiON, polyimide (PI), polypropylene (PP), polyethylene (PE), benzocyclobutene (BCB), polybenzoxazole (PBO), bismaleimide triazine (BT), epoxy resin, phenol resin, silicone resin or acrylate polymer. In some examples, dielectric structure 430A can be formed by any one of a variety of processes including PVD, CVD, MOCVD, ALD, LPCVD, PECVD, printing, spin coating, spray coating, sintering or thermal oxidation. In some examples, dielectric structure 430A can have a thickness in a range from approximately 10 microns to approximately 50 microns from surface of membrane 420.

FIG. 11D shows a cross-sectional view and a top view of barrier 490 at a later stage of manufacture. In the example shown in FIG. 11D, a patterning process can be performed on dielectric structure 430A, forming stiffener 430 having through-hole 434, as shown by the top view in FIG. 11D. In some examples, stiffener 430 can be formed from dielectric structure 430A by, for example, a deposition process, such as physical deposition or chemical deposition of photoresist, a lithography process performed on photoresist, such as photolithography, electron beam lithography, ion beam lithography or X-ray lithography, a patterning process, such as diamond patterning, and/or an etching process performed on dielectric structure 430A. Through-hole 434 can have a diameter in a range from approximately 500 microns to approximately 900 microns. As described above, one through-hole 434 can be formed at the center of dielectric structure 430A, completing stiffener 430.

Figure 11E:
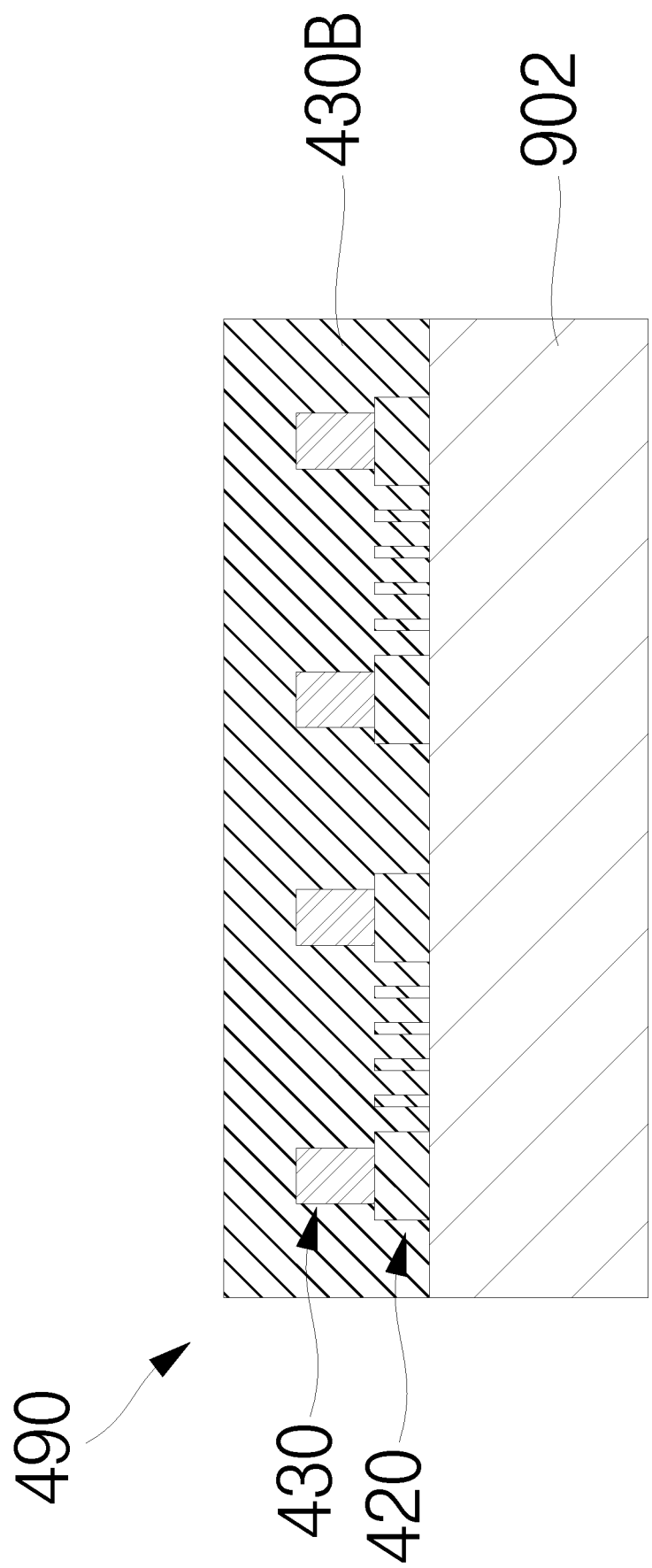

FIG. 11E shows a cross-sectional view of barrier 490 at a later stage of manufacture. In the example shown in FIG. 11E, barrier 490 including membrane 420 and stiffener 430 can be covered by dielectric structure 430B. In some examples, dielectric structure 430B can be referred to as or can comprise $Si_3N_4$, $SiO_2$, SiON, polyimide (PI), polypropylene (PP), polyethylene (PE), benzocyclobutene (BCB), polybenzoxazole (PBO), bismaleimide triazine (BT), epoxy resin, phenol resin, silicon resin or acrylate polymer. In some examples, dielectric structure 430B can be formed by any one of a variety of processes including PVD, CVD, MOCVD, ALD, LPCVD, PECVD, printing, spin coating, spray coating, sintering or thermal oxidation. In some examples, dielectric structure 430B can have a thickness in a range from approximately 1 micron to approximately 10 microns from a surface of stiffener 430.

Figure 11F:
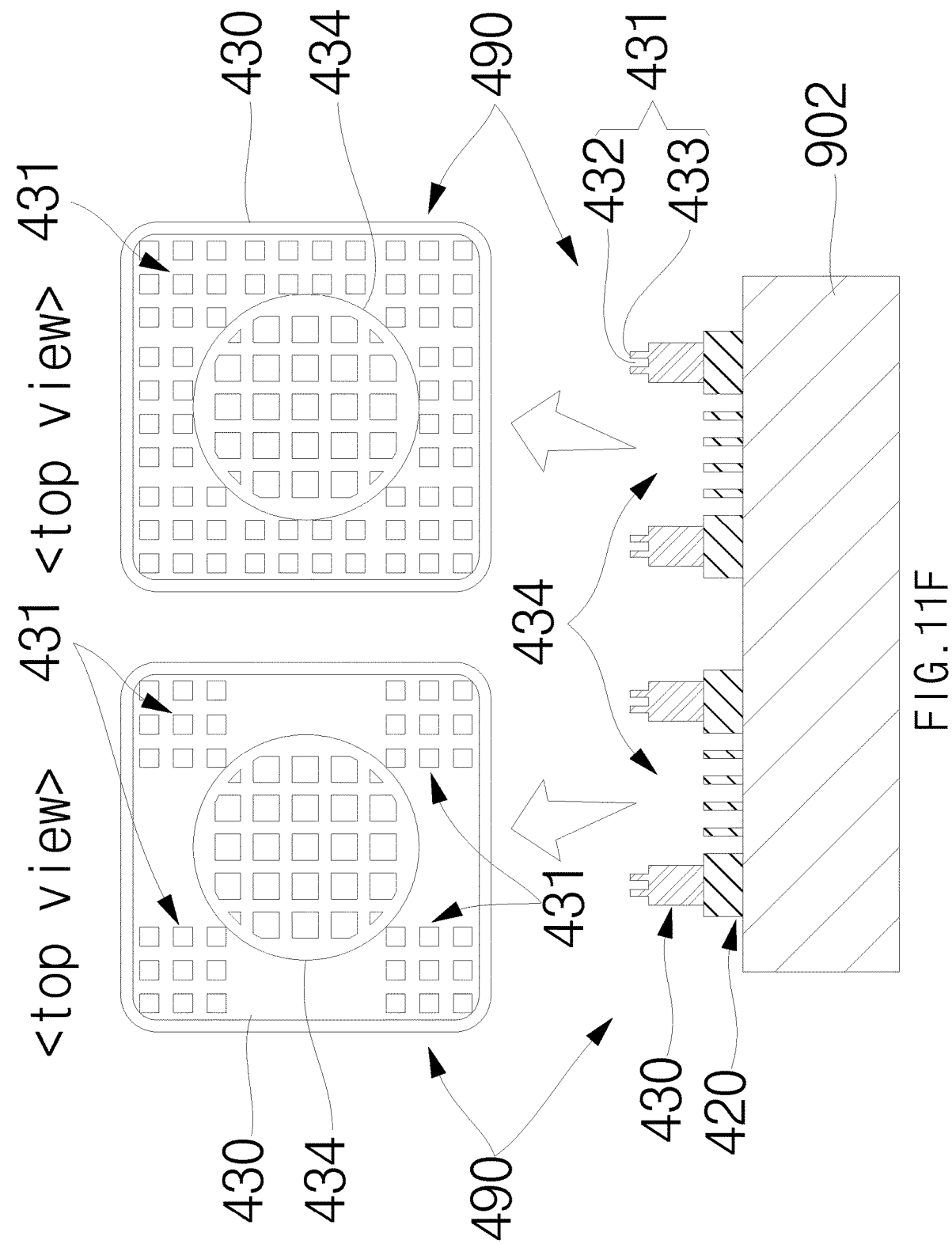

FIG. 11F shows a cross-sectional view and top views of barrier 490 at a later stage of manufacture. In the example shown in FIG. 11F, a patterning process can be performed on stiffener 430, forming one or more protrusion patterns 431 on an outer region of through-hole 434 formed in stiffener 430. In some examples, protrusion patterns 431 can be formed on regions corresponding to four corners of stiffener 430 or on regions corresponding to four sides of stiffener 430, as shown by a left top view in FIG. 11F. In some examples, protrusion patterns 431 can be formed on the whole outer surface around the perimeter of through-hole 434, as shown by a right top view in FIG. 11F. In some examples, protrusion patterns 431 can be formed on stiffener 430 by, for example, a deposition process, such as physical deposition or chemical deposition of photoresist, a lithography process performed on photoresist, such as photolithography, electron beam lithography, ion beam lithography or X-ray lithography, a patterning process, such as diamond patterning, and/or an etching process performed on stiffener 430. Pitches, widths, depths and/or thicknesses of recesses 432 and protrusions 433 constituting protrusion patterns 431 can be in a range from approximately 3 microns to approximately 30 microns. Although protrusions 433 of protrusion pattern 431 are shown arranged as a matrix of columns in the present example, in some examples protrusions 433 of protrusion pattern 431 can be shaped or arranged differently. For instance, protrusions 433 can instead be shaped as one or more adjacent lines or walls defining one or more recesses 432 between them. In some examples, protrusions 433 can be patterned as shapes other than a matrix pattern. In some examples, barriers 490 could be separated from planar base 902 at this point if desired for attachment to a MEMS device such as MEMS device 110. FIG. 11F is an example where the protrusion pattern is provided a separate layer atop the stiffener structure.

FIG. 11G shows a cross-sectional view of barrier 490 at a later stage of manufacture. In the example shown in FIG. 11G, mounting film 901 can be attached to protrusion patterns 431 of stiffener 430. In some examples, adhesion between stiffener 430 and mounting film 901 can be lessened or weakened as areas of recesses 432 of protrusion patterns 431 are increased. Therefore, the adhesion between stiffener 430 and mounting film 901 can be controlled by appropriately adjusting the recessed areas of protrusion patterns 431.

FIG. 11H shows a cross-sectional view of barrier 490 at a later stage of manufacture. In the example shown in FIG. 11H, planar base 902 can be separated from membrane 420.

In some examples, planar base 902 can be separated from barrier 490 by applying heat, light having a particular wavelength (for example, UV light), or a physical force to membrane 420 and planar base 902. Barrier 490 can remain mounted on mounting film 901. In some examples, protrusion patterns 431 of stiffener 430 can be mounted on mounting film 901. Since stiffener 430 can comprise protrusion patterns 431 and mounting film 901 can comprise a semi-rigid adhesive or an adhesive having a high viscosity, adhesion area between stiffener 430 and mounting film 901 can be relatively small, and adhesion force between stiffener 430 and mounting film 901 can be lowered.

Figure 11I:
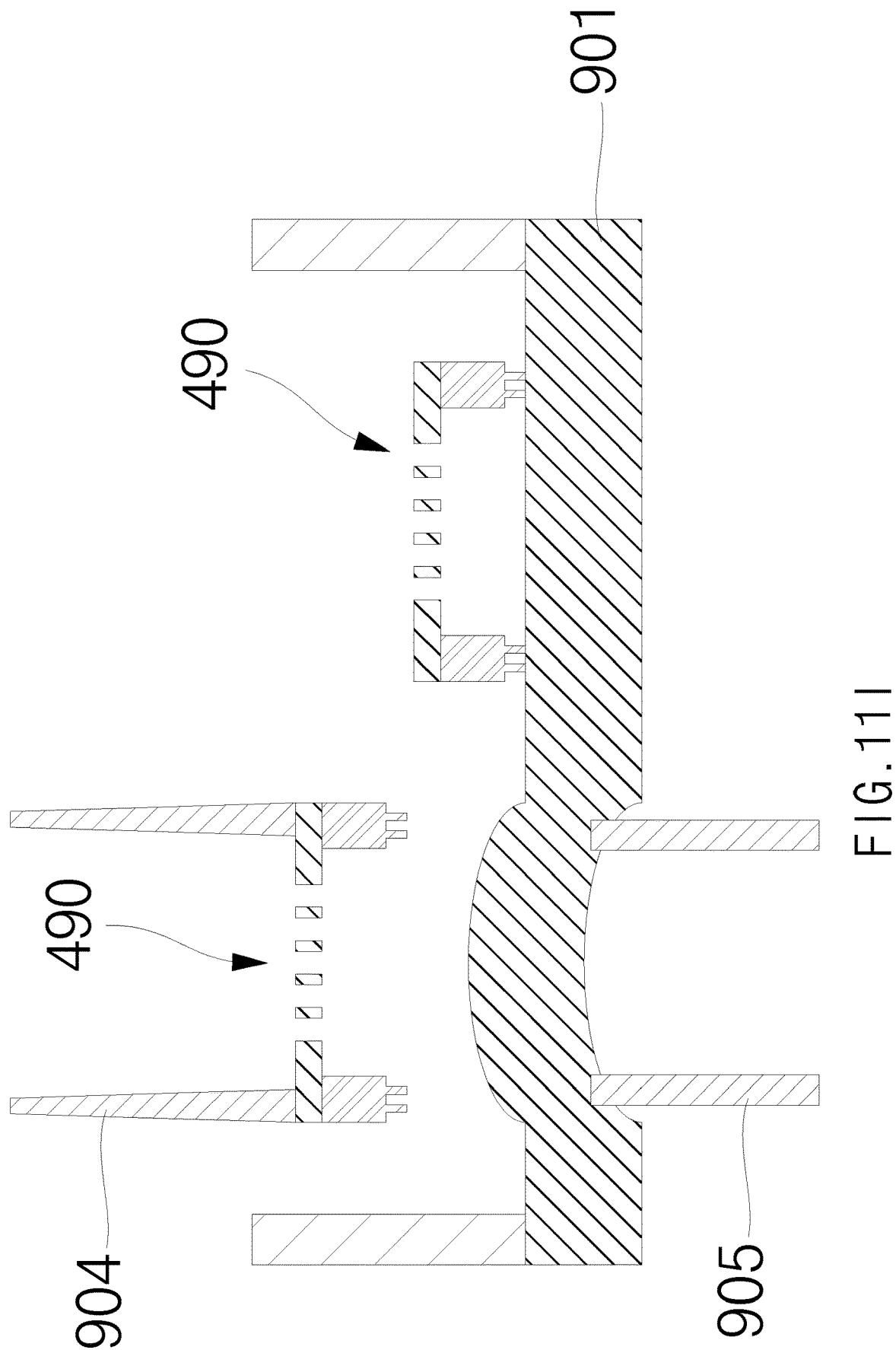

FIG. 11I shows a cross-sectional view of barrier 490 at a later stage of manufacture. In the example shown in FIG. 11I, barrier 490 can be picked up by pick-and-place equipment 904 and placed on, for example, base substrate 140. In some examples, a bottom surface of mounting film 901 corresponding to barrier 490 can be elevated by needles 905. Accordingly, the adhesion between barrier 490 and mounting film 901 can be further weakened. Pick-and-place equipment 904 can couple to a top surface of barrier 490 to transfer and place the barrier 490 on, for example, base substrate 140. In some examples, pick-and-place equipment 904 can contact barrier body 423 of membrane 420 to pick up barrier 490.

In some examples, features of this method for manufacturing barrier 490 can be commonly applied to example methods for manufacturing barriers disclosed in the present disclosure.

FIG. 12A to 12E show cross-sectional views and top views of an example method for manufacturing example barrier 790. In some examples, barrier 790 can be applied to one or more of the semiconductor devices and/or MEMS devices described in the present disclosure. Barrier 790 can comprise several features or elements that can be similar to corresponding features or elements of other barriers described in the present disclosure.

FIG. 12A shows a cross-sectional view and a top view of barrier or barrier structure 790 at a stage of manufacture. In some examples, such stage of manufacture can be achieved by performance of one or more stages similar to those described above with respect to FIGS. 11A-11D. In the example shown in FIG. 12A, membrane 720 can comprise elements such as through-holes 721, barrier strands 722, and barrier body 723. Membrane 720 and its elements can be similar to other membranes and corresponding elements described in the present disclosure. In addition, stiffener 730 having through-hole 734 can be attached to barrier body 723. Here, a diameter of one through-hole 721 can be defined as a first diameter. In addition, a thickness or cross-section of each of barrier strands 722 can be defined as a first thickness.

FIG. 12B shows a cross-sectional view and a top view of barrier 790 at a later stage of manufacture. In the example shown in FIG. 12B, membrane 720 can be dipped into a dielectric solution, or a dielectric material or a dielectric solution can be sprayed or spin-coated on membrane 720, forming conformal membrane layers 722A and 723A on a surface of membrane 720. In some examples, conformal membrane layer 722A can be formed on barrier strands 722, and conformal membrane layer 723A can be formed on barrier body 723. In some examples, conformal membrane layers 722A and 723A can be portions of a same conformal layer.

In some examples, conformal membrane layers 722A and 723A can be formed by any one of a variety of processes including PVD, CVD, MOCVD, ALD, LPCVD, PECVD, printing, sintering or thermal oxidation. In some examples, a single mask can be used to form conformal membrane layers 722A and 723A. In addition, in some examples, one electrical polarity (e.g., positive (+) polarity) can be supplied to membrane 720, and another electrical polarity (e.g., negative (−) polarity) can be supplied to dielectric material or dielectric solution. Accordingly, a time required for forming conformal membrane layers 722A and 723A can be shortened and product quality can be improved. In some examples, dielectric material or dielectric solution for conformal membrane layers 722A and 723A can be referred to as or can comprise $Si_3N_4$, $SiO_2$, SiON, polyimide (PI), benzocyclobutene (BCB), polybenzoxazole (PBO), bismaleimide triazine (BT), epoxy resin, phenol resin, silicone resin or acrylate polymer.

By the addition of conformal membrane layers 722A and 723A, a second diameter for through-hole 721A of conformal membrane layer 722A can be formed, being smaller than the first diameter of through-hole 721 shown in FIG. 12A. In addition, a second thickness or cross-section of barrier strands 722A can be formed, being larger than the first thickness of barrier strands 722 shown in FIG. 12A. Such change or variation in the through-hole diameter and/or the barrier strand thickness can be in a range from, for example, approximately 100 nanometers (nm) to approximately 10 microns.

FIG. 12C shows a cross-sectional view and a top view of barrier 790 at a later stage of manufacture. In the example shown in FIG. 12C, membrane 720 can be processed by the same method as illustrated in FIG. 12B using the same material as illustrated in FIG. 12B, forming additional conformal membrane layers 722B and 723B.

By the addition of conformal membrane layers 722A and 723A, a third diameter for through-hole 721B of conformal membrane layer 722B can be formed, being smaller than the second diameter of through-hole 721A shown in FIG. 12B. In addition, a third thickness or cross-section of barrier strands 722B can be larger than the second thickness of barrier strands 722A shown in FIG. 12B. Such change or variation in the through-hole diameter and/or the barrier strand thickness can be in a range from, for example, approximately 100 nm to approximately 10 microns. In some examples, further conformal membrane layers can be formed by similarly processing membrane 720 as many times as required. In some examples, protrusion patterns 431 described above can be formed on stiffener 730 if desired.

Figure 12D:
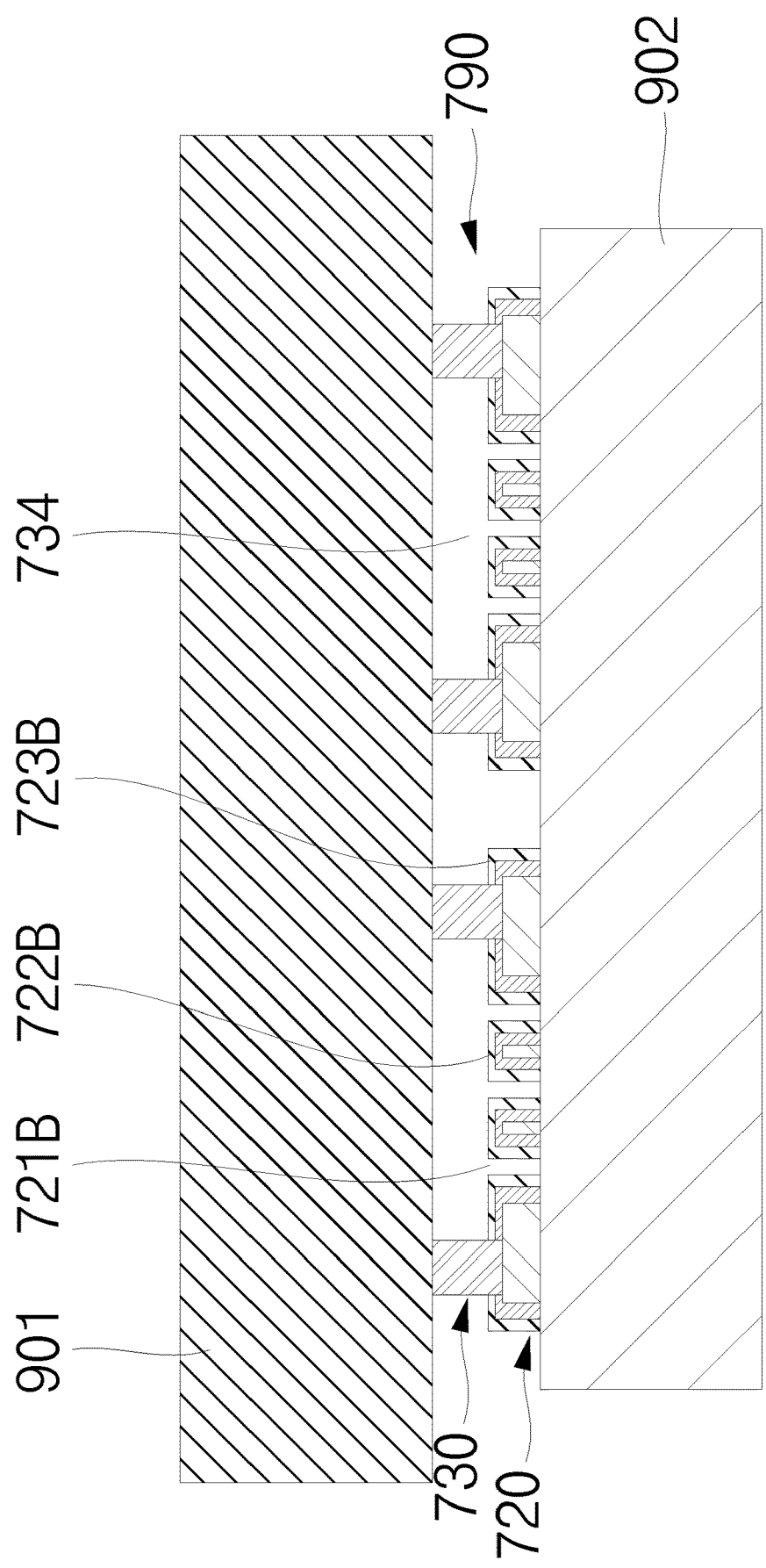

FIG. 12D shows a cross-sectional view of barrier 790 at a later stage of manufacture. In the example shown in FIG. 12D, mounting film 901 can be attached to stiffener 730.

Figure 12E:
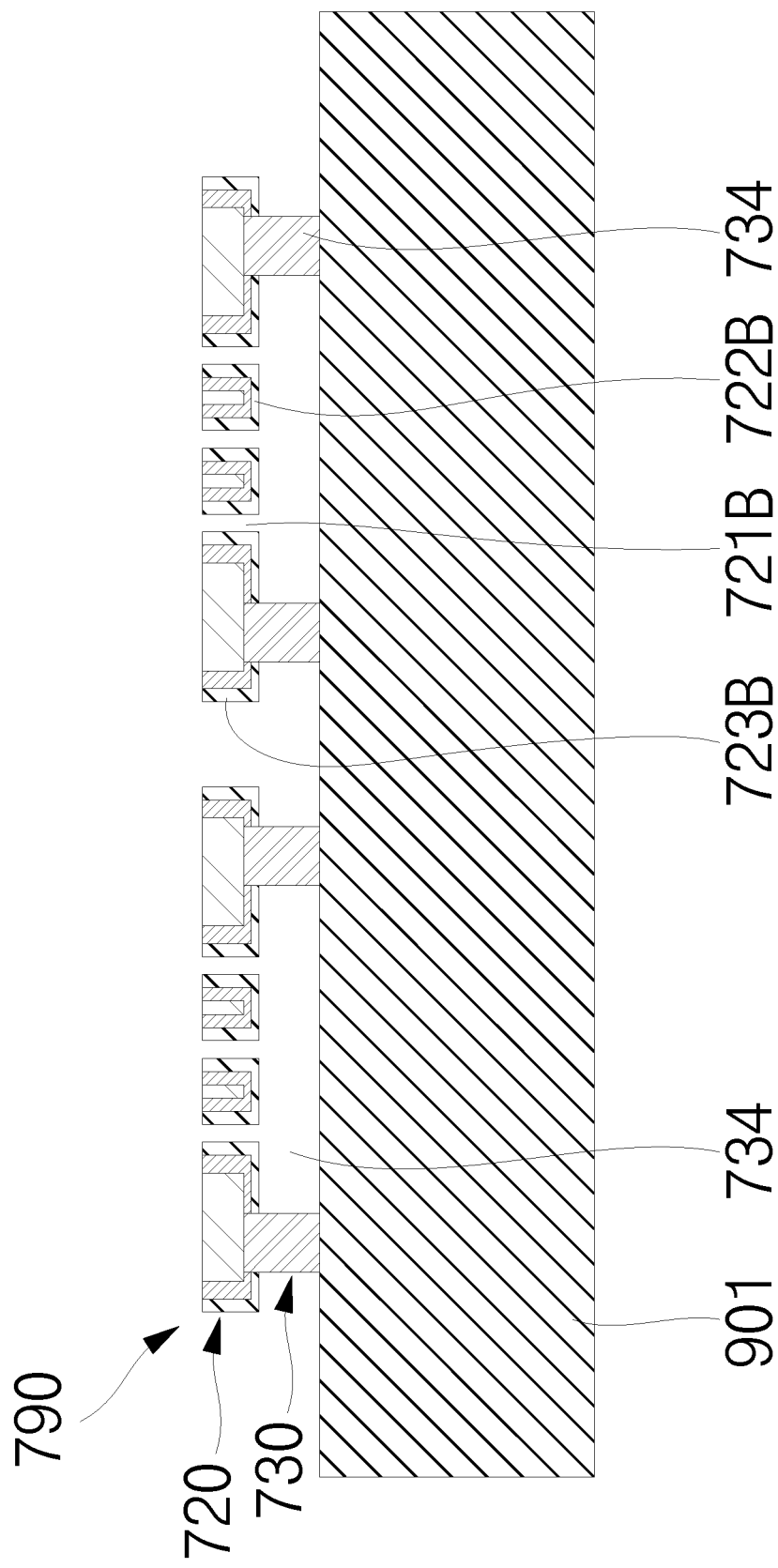

FIG. 12E shows a cross-sectional view of barrier 790 at a later stage of manufacture. In the example shown in FIG. 12E, planar base 902 can be separated from membrane 720. In some examples, planar base 902 can be separated from membrane 720 by applying heat, light having a particular wavelength, or a physical force to membrane 720 and planar base 902. Barrier 790 can remain mounted on mounting film 901.

By following the process described above, the diameter of through-hole 721 and/or the thickness of barrier strands membrane 722 formed on membrane 720 can be controlled by a layer-by-layer (LBL) process by iterative or sequential addition of subsequent conformal layers such as 722A, 722B, 723A, 723B, etc. Such processing can yield enhanced fine pitches for barrier 790, and in some examples, can permit the use of a single or same mask for each subsequent conformal layer. This allows for predetermined tuning of barrier 790 depending on the environment MEMS sensor 110 is intended to be used in.

Figure 13A:
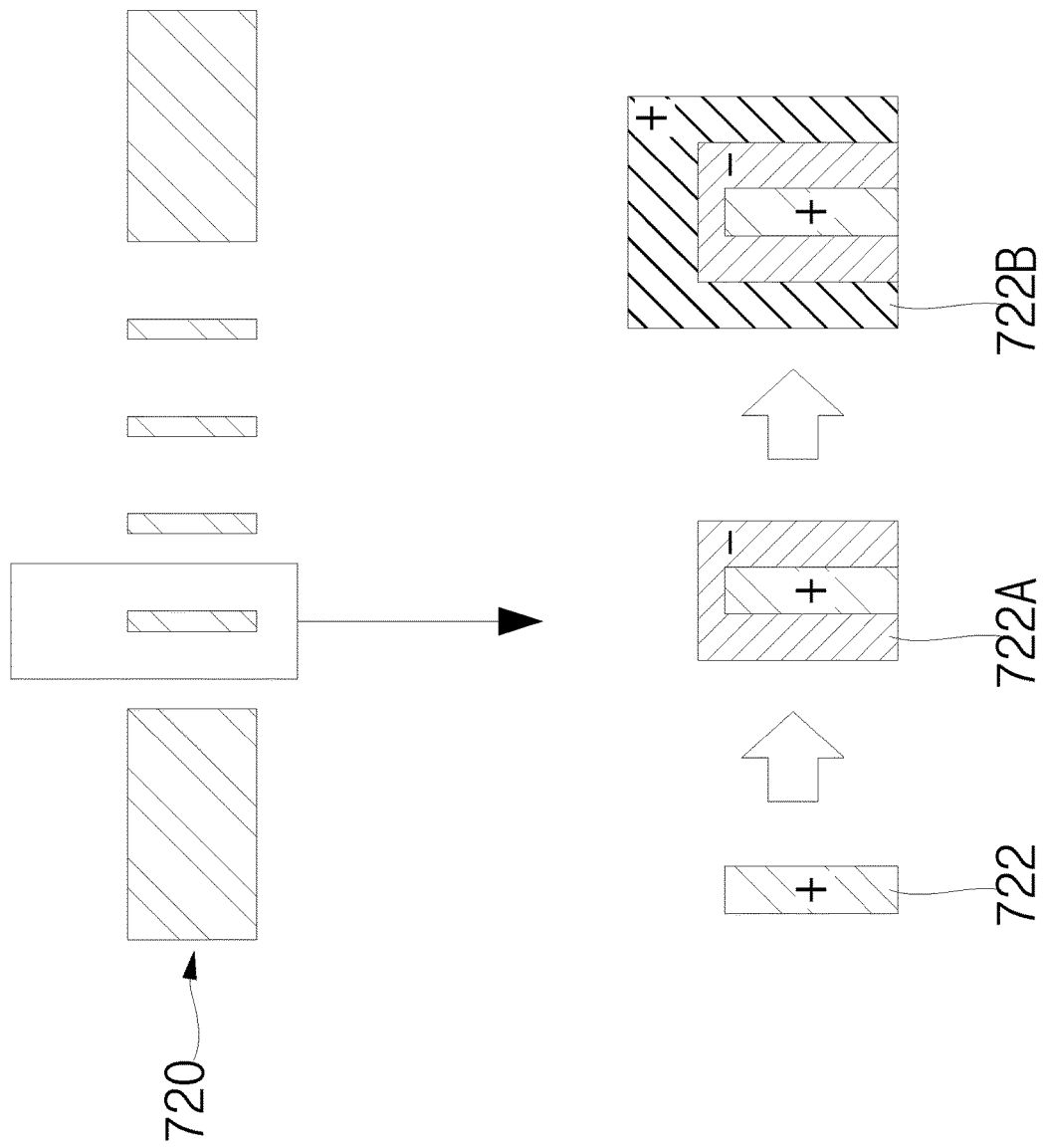

FIGS. 13A and 13B show cross-sectional views of an example method for manufacturing an example barrier. The different stages shown in FIGS. 13A-13B can correspond to related stages of the method described with respect to FIGS. 12A through 12F. In the example shown in FIGS. 13A and 13B, the diameter of through-hole 721 and/or the width of barrier membrane 722 (including conformal membrane layer 722A, 722B) of membrane 720 can be controlled by the LBL process described previously.

In some examples, as the number of times of LBL processes performed is increased, the diameter of through-hole 721 (or through-hole 721A, 721B) can be gradually decreased, and the thickness or cross section of barrier strands 722 can be gradually increased. In addition, when LBL process is performed, opposite electrical polarities can be supplied to a pre-formed dielectric material and to additive dielectric material, respectively, allowing the pre-formed dielectric material and the additive dielectric material to rapidly and securely adhere to each other.

FIGS. 14A to 14F show cross-sectional views of an example method for manufacturing an example barrier 890. In some examples, barrier 890 can be applied to one or more of the semiconductor devices described in the present disclosure. Barrier 890 can comprise several features or elements that can be similar to corresponding features or elements of other barriers described in the present disclosure.

Figure 14A:
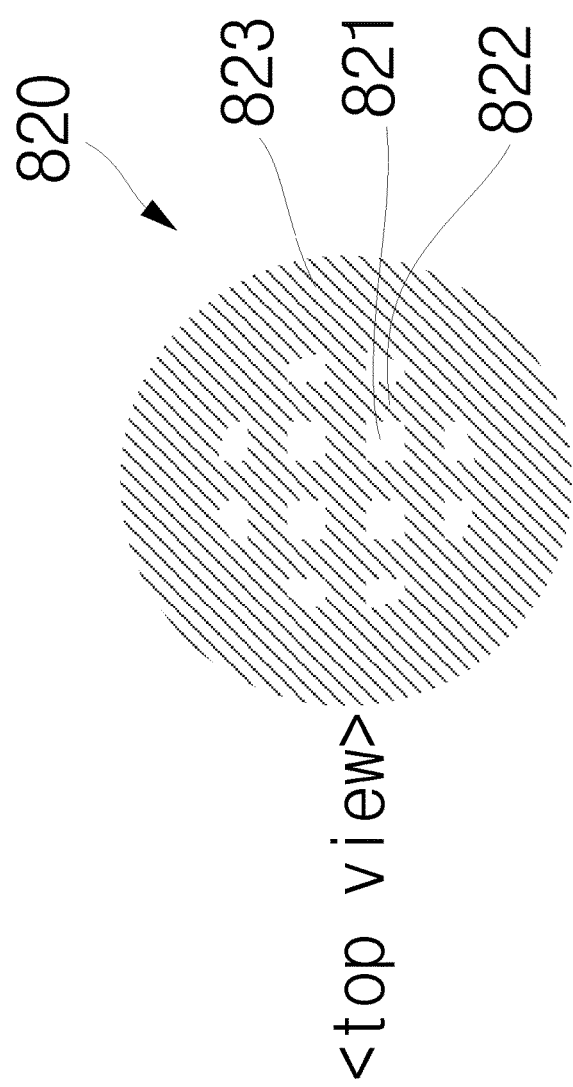
Figure 14A:
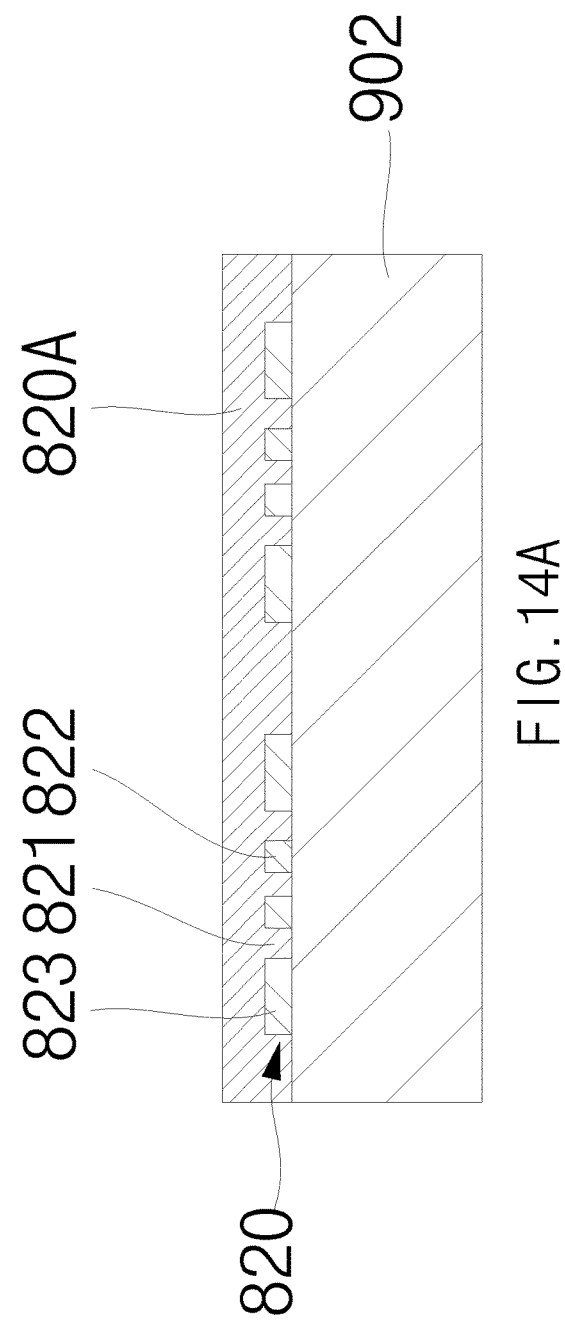

FIG. 14A shows a cross-sectional view and a top view of barrier 890 at a later stage of manufacture. In some examples, such stage of manufacture can be achieved by performance of one or more stages similar to those described above with respect to FIGS. 11A-11B. In the example shown in FIG. 14A, membrane 820 can comprise elements such as barrier through-holes 821, barrier strands 822, and base 823, which can be covered by dielectric structure 820A. Membrane 820 and its elements can be similar to other membranes and corresponding elements described in the present disclosure. In some examples, dielectric structure 820A can be referred to as or can comprise $Si_3N_4$, $SiO_2$, SiON, polyimide (PI), polypropylene (PP), polyethylene (PE), benzocyclobutene (BCB), polybenzoxazole (PBO), bismaleimide triazine (BT), epoxy resin, phenol resin, silicone resin or acrylate polymer. In some examples, dielectric structure 820A can be formed by any one of a variety of processes including PVD, CVD, MOCVD, ALD, LPCVD, PECVD, printing, spin coating, spray coating, sintering or thermal oxidation. In some examples, dielectric structure 820A can have a thickness in a range from approximately 1 micron to approximately 10 microns from membrane 820.

Figure 14B:
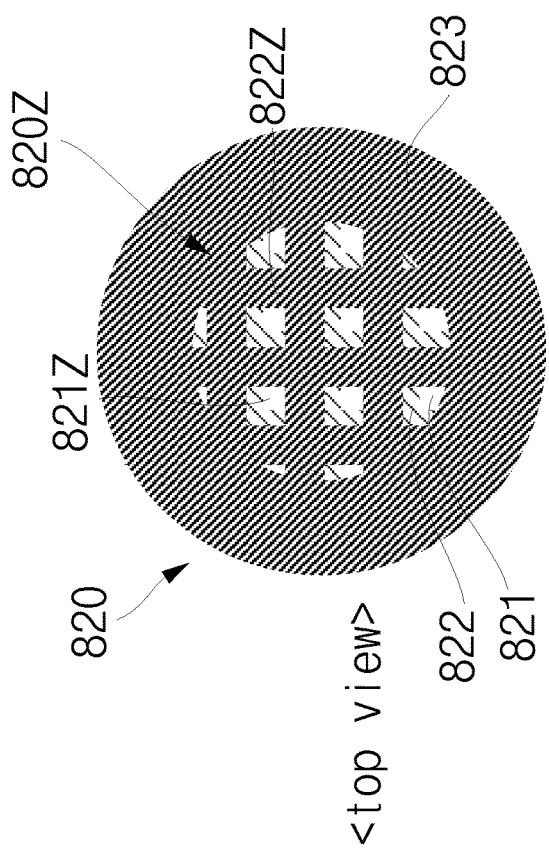
Figure 14B:
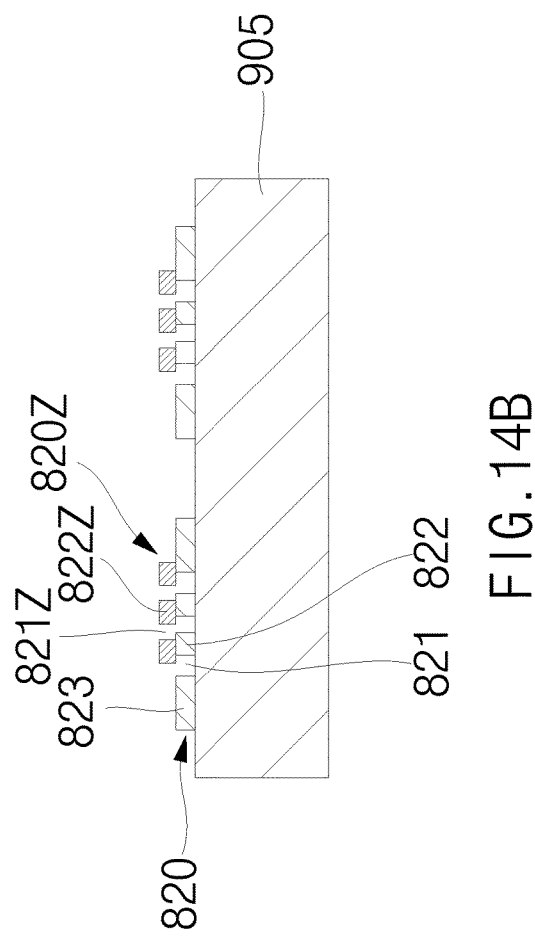

FIG. 14B shows a cross-sectional view of barrier 890 at a later stage of manufacture. In the example shown in FIG. 14B, stacked membrane 820Z can be formed on membrane 820. Stacked membrane 820Z can comprise or define stacked barrier through-holes 821Z and stacked barrier strands 822Z, and can be formed from dielectric structure 820A by, for example, a deposition process, such as physical deposition or chemical deposition of photoresist, a lithography process performed on photoresist, such as photolithography, electron beam lithography, ion beam lithography or X-ray lithography, a patterning process, such as diamond patterning, and/or an etching process performed on dielectric structure 820A. In some examples, stacked barrier through-holes 821Z and/or stacked barrier strands 822Z can have pitches respectively similar to those of barrier through-holes 821 and/or barrier strands 822, though in other examples such pitches need not be similar. In some examples, vertical/horizontal positions of stacked barrier through-holes 821Z and of stacked barrier strands 822Z can be respectively offset from those of barrier through-holes 821 and barrier strands 822. Accordingly, an overlapped pitch based on overlapping of barrier through-holes 821 and stacked barrier through-holes 821Z can be formed, further reduced than the corresponding pitch of barrier through-holes 821. Similarly, an overlapped pitch based on overlapping of barrier strands 822 and stacked barrier strands 822Z, can be formed further reduced than the corresponding pitch of barrier strands 822.

Figure 14C:
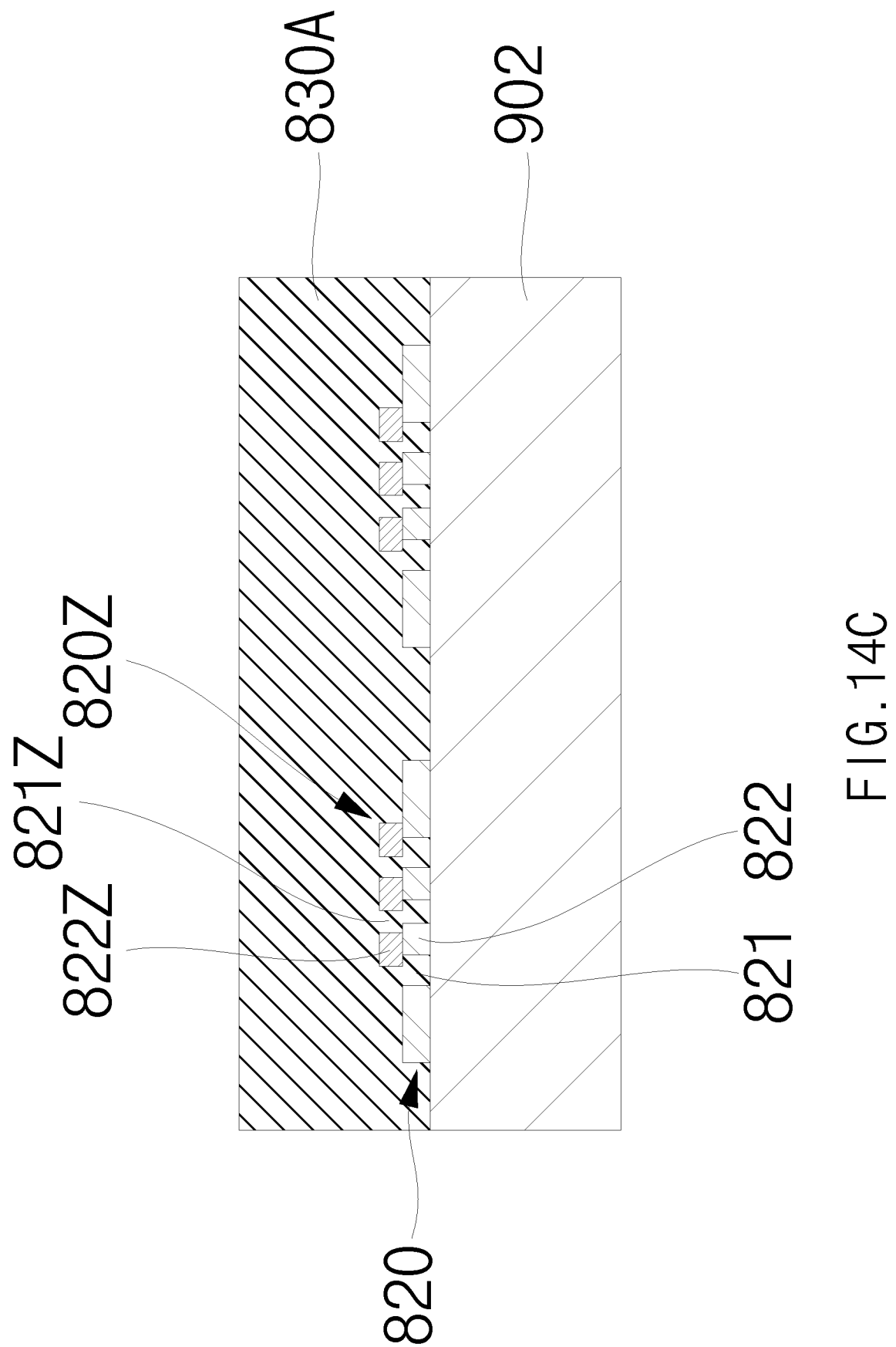

FIG. 14C shows a cross-sectional view of barrier 890 at a later stage of manufacture. In the example shown in FIG. 14C, membrane 820 can be covered by dielectric structure 830A. In some examples, dielectric structure 830A can cover membrane 820 and stacked membrane 820A. Here, dielectric structure 830A can be similar to dielectric structure 820A, such as in terms of manufacturing method, material and/or dimensions.

Figure 14D:
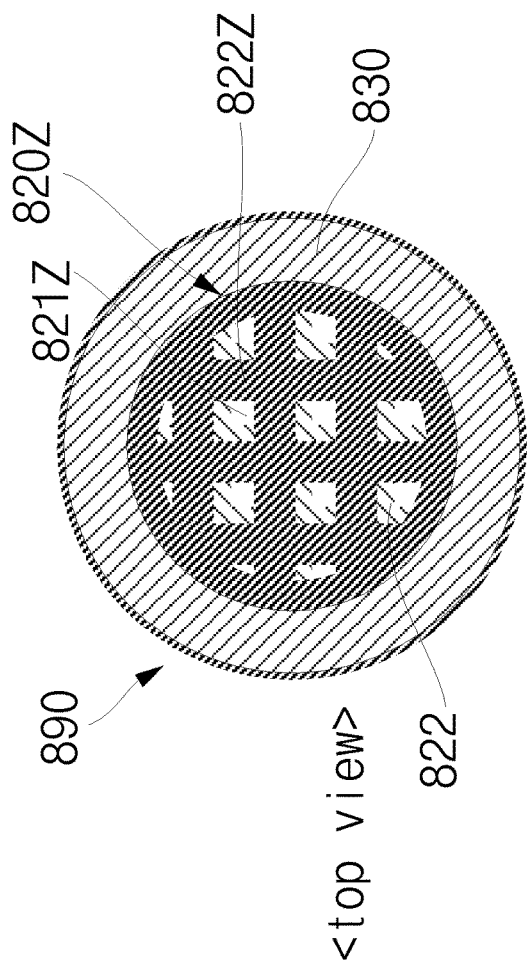
Figure 14D:
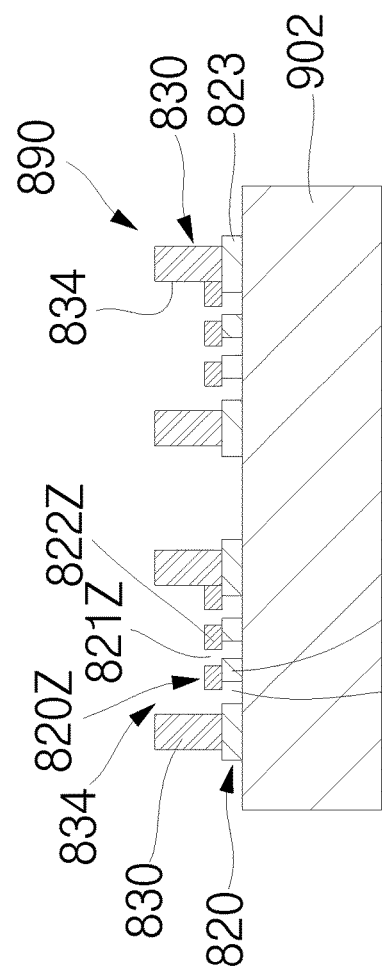

FIG. 14D shows a cross-sectional view and a top view of barrier 890 at a later stage of manufacture. In the example shown in FIG. 14D, a patterning process can be performed on dielectric structure 830A, forming through-hole 834 and defining stiffener 830. Here, stiffener 830 can be similar to stiffener 430 described above, such as in terms of manufacturing method, material and/or dimensions. Barriers 890 can be picked up by pick-and-place equipment and subsequently attached as part of one of the different semiconductor devices described here and/or attached to MEMS device 110. In some examples, barrier 890 can be separated from planar base 902 at this point if desired for attachment to a MEMS device such as MEMS device 110.

FIG. 14E shows a cross-sectional view of barrier 890 at a later stage of manufacture. In the example shown in FIG. 14E, mounting film 901 can be attached to stiffener 830. In some examples, protrusion patterns 431 can be further formed as described above on a surface of stiffener 830 if desired.

Figure 14F:
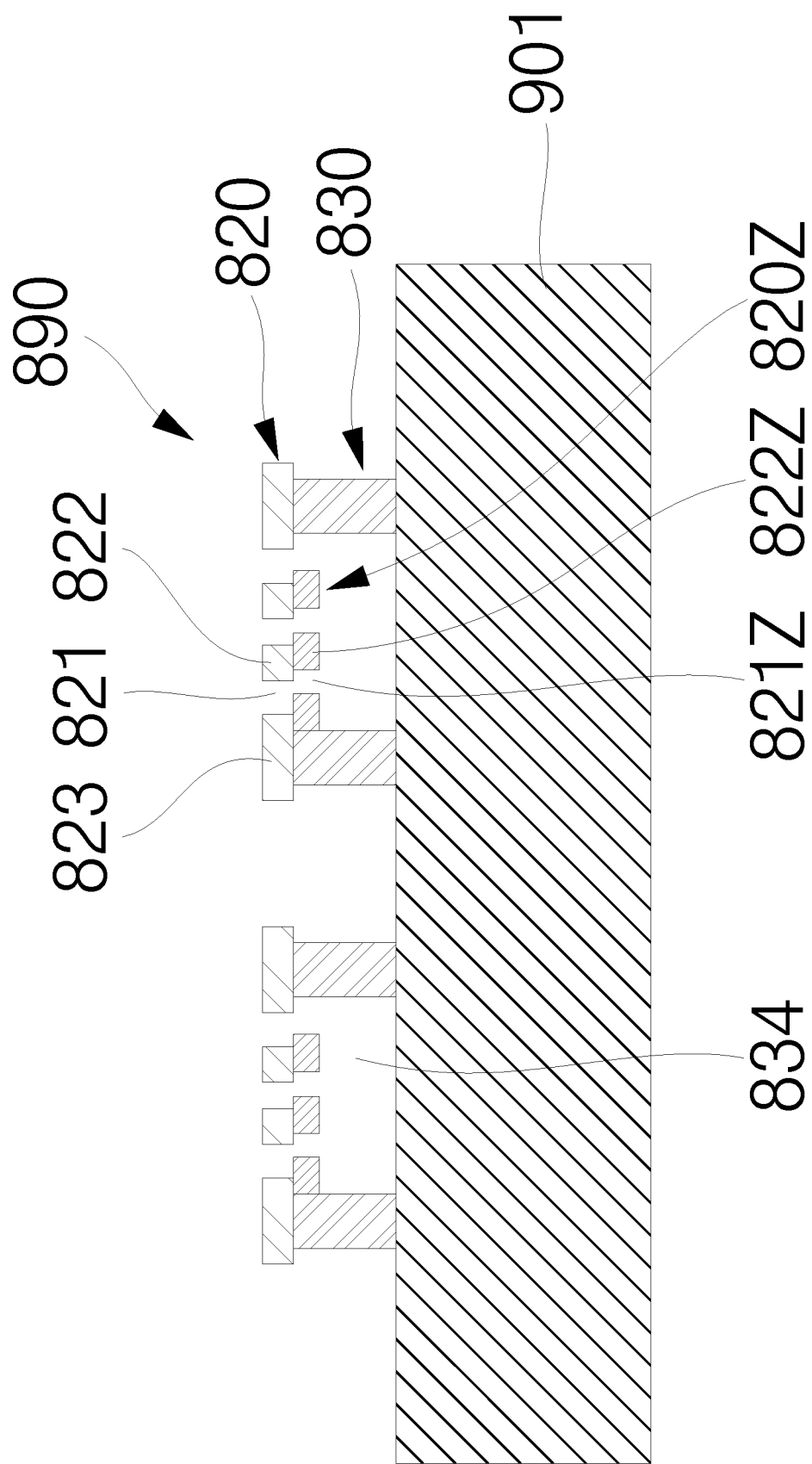

FIG. 14F shows a cross-sectional view of barrier 890 at a later stage of manufacture. In the example shown in FIG. 14F, planar base 902 can be separated from membrane 820. The separation process can be performed as previously described with respect to planar base 902. Barriers 890 can be picked up by pick-and-place equipment and subsequently attached as part of one of the different semiconductor devices described here and/or attached to MEMS device 110.

Figure 15:
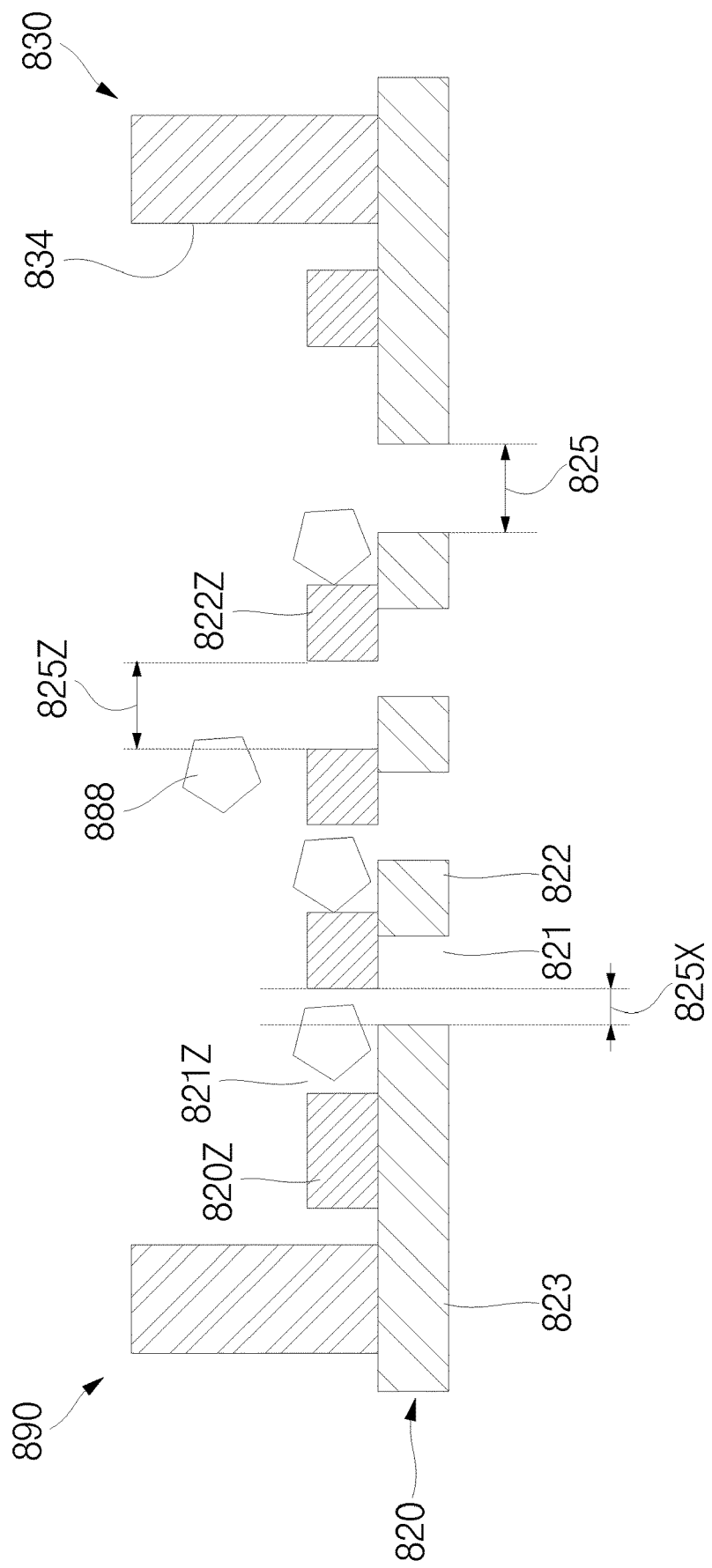
FIG. 15 is an enlarged cross-sectional view of an example barrier.

FIG. 15 is an enlarged cross-sectional view of example barrier 890. In the example shown in FIG. 15, a pitch of barrier through-holes 821 and/or of barrier strands 822 can be defined as a first pitch, as indicated by rough pitch 825. In addition, a pitch of stacked through-hole 821Z and/or of stacked barrier strands 822Z can be defined as a second pitch, as indicated by rough pitch 825Z. In some examples, horizontal/vertical positions of barrier through-holes 821 or barrier strands 822 can be offset from those of stacked through-holes 821Z or stacked barrier strands 822Z. Accordingly, a third pitch indicated by fine pitch 825X and defined by offset overlapping of barrier through-holes 821 with stacked through-holes 821Z, and/or defined by offset overlapping of barrier strands 822 with stacked barrier strands 822Z, can be smaller than either of rough pitch 825 and/or 825Z. In some examples, fine pitch 825X can be in a range from approximately 0.001 microns to approximately 2 microns. Barrier 890 having such a fine pitch 825X can make it possible to prevent smaller external particles from being induced into cavity 117 of MEMS sensor 110.

In summary, an electronic device structure and associated methods have been described that include a barrier configured to reduce the effect of contaminants on the electronic device. In some examples, the barrier includes a membrane having a barrier body and first barrier strands bounded by the barrier body and defining first through-holes. In some examples, conformal membrane layers can be added to the first barrier strands to reduce the size of the first through-holes. In other examples, second barrier strands can be added on and at least partially overlapping the first barrier strands. The second barrier strands define second through-holes laterally offset from the first through-holes. In some examples, a protrusion pattern is disposed as part of the barrier, which can be configured to reduce the contact area of the barrier to contact films used during the fabrication process This advantageously improves the ease in which the electronic die can be removed from the contact film during, for example, pick-and-place processing. In other examples, the barrier structure can be provided while the electronic device is among a plurality of electronic device as part of a semiconductor wafer to improve manufacturability. The structures and method described herein improve the reliability and manufacturability of electronic devices.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

What is claimed is:

1. An electronic device, comprising:
a base substrate comprising:
a substrate top side; a substrate bottom side opposite to the substrate top side; a passageway extending through the base substrate from the substrate top side to the substrate bottom side; a first conductive structure; and a dielectric structure;
a sensor device comprising: a sensor top side; a sensor bottom side opposite to the sensor top side; and a cavity extending partially inward from the sensor bottom side; and a barrier attached to the sensor bottom side and extending across the cavity, wherein: the sensor device is coupled to the first conductive structure;
the barrier comprises first barrier strand structures defining first barrier through-holes; and the barrier is attached to the substrate top side so that the first barrier through-holes overlie the passageway and the barrier is interposed between the sensor bottom side and the substrate top side; and one or more of: second barrier strand structures attached to the first barrier strand structures, the second barrier strand structures defining second barrier through-holes that are offset with respect to the first barrier through-holes; a conformal layer over the first barrier strand structures.

2. The electronic device of claim 1, wherein:
the electronic device comprises the second barrier strand structures but not the conformal layer.

3. The electronic device of claim 1, wherein:
the electronic device comprises the conformal layer but not the second barrier strand structures.

4. The electronic device of claim 1, wherein:
the barrier comprises a singulated structure.

5. The electronic device of claim 1, wherein:
the sensor device comprises a semiconductor die;
the sensor device comprises a sensor lateral side extending between the sensor top side and the sensor bottom side;
the barrier comprises a barrier lateral side; and
the barrier lateral side is coplanar with the sensor lateral side.

6. The electronic device of claim 1, further comprising:
a cover structure comprising a cover wall and a side wall;
wherein:
the side wall is coupled to the substrate top side.

7. The electronic device of claim 6, further comprising:
a second conductive structure associated with the cover wall and coupled to the first conductive structure.

8. The electronic device of claim 7, further comprising:
a third conductive structure associated with the side wall and coupled to the first conductive structure and the second conductive structure.

9. The electronic device of claim 1, further comprising:
an adhesive,
wherein:
the barrier is fixed to the substrate top side with the adhesive.

10. The electronic device of claim 1, further comprising:
a stiffener interposed between the barrier and the substrate top side.

11. The electronic device of claim 10, wherein:
the stiffener comprises one or more protrusion patterns.

12. The electronic device of claim 1, wherein:
the barrier comprises a polymer film fixed to the sensor bottom side.

13. An electronic device, comprising:
a base substrate comprising:
a substrate top side;
a substrate bottom side opposite to the substrate top side;
a passageway extending through the base substrate from the substrate top side to the substrate bottom side; and
a first conductive structure;
a sensor device comprising:
a sensor top side;
a sensor bottom side opposite to the sensor top side; and
a cavity extending partially inward from the sensor bottom side;
a barrier fixed to the sensor bottom side and extending across the cavity; and
a cover structure comprising a cover wall, a side wall coupled to the cover wall and the substrate top side, a second conductive structure associated with the cover wall;
wherein:
the second conductive structure is coupled to the first conductive structure;
the sensor device is coupled to the first conductive structure;
the barrier comprises first barrier strand structures defining first barrier through-holes; and
the barrier is attached to the substrate top side so that the first barrier through-holes overlie the passageway and the barrier is interposed between the sensor bottom side and the substrate top side.

14. The electronic device of claim 13, further comprising:
second barrier strand structures attached to the first barrier strand structures, the second barrier strand structures defining second barrier through-holes that are offset with respect to the first barrier through-holes.

15. The electronic device of claim 13, further comprising:
one or more conformal layers over the first barrier strand structures.

16. The electronic device of claim 13, further comprising:
a stiffener interposed between the barrier and the substrate top side.

17. The electronic device of claim 13, wherein:
the barrier comprises a singulated polymer film.

18. An electronic device, comprising:
a first electronic device comprising a first surface and a second surface opposite to the first surface, and a cavity extending partially inward from the second surface to provide a diaphragm adjacent to the first surface; and a barrier coupled to the second surface of the first electronic device, wherein the barrier extends across the cavity and comprises: a first membrane including:
a first barrier body; and first barrier strands bounded by the first barrier body and defining first through-holes; and one or more of: second barrier strands on the first barrier strands and defining second through-holes that are laterally offset from the first through-holes; a conformal membrane layer over the first barrier strands, and wherein: the barrier includes the conformal membrane layer over the first barrier strands; the first membrane comprises an organic material; the conformal membrane layer comprises a deposited inorganic material; the electronic device further comprises: a base substrate including a dielectric structure, a conductive structure, and a passageway extending through a portion of the base substrate; and the first electronic device is attached to the base substrate adjacent to the passageway.

19. The electronic device of claim 18, wherein:
the barrier includes the second barrier strands;
the second barrier strands are joined to top sides of the first barrier strands;
the electronic device further comprises:
a base substrate including a dielectric structure, a conductive structure, and a passageway extending through a portion of the base substrate; and
the first electronic device is attached to the base substrate adjacent to the passageway.

* * * * *